US010673387B2

(12) United States Patent
Srindhi Embar et al.

(10) Patent No.: US 10,673,387 B2
(45) Date of Patent: Jun. 2, 2020

(54) AMPLIFIERS WITH IN-PACKAGE RADIAL STUB HARMONIC TRAPS

(71) Applicant: NXP USA, Inc., Austin, TX (US)

(72) Inventors: Ramanujam Srindhi Embar, Gilbert, AZ (US); Roy McLaren, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 51 days.

(21) Appl. No.: 15/832,470

(22) Filed: Dec. 5, 2017

(65) Prior Publication Data

US 2019/0173431 A1    Jun. 6, 2019

Related U.S. Application Data

(63) Continuation of application No. 15/832,381, filed on Dec. 5, 2017.

(51) Int. Cl.
*H03F 1/02* (2006.01)
*H03F 3/195* (2006.01)
(Continued)

(52) U.S. Cl.
CPC .......... *H03F 1/0288* (2013.01); *H01L 23/66* (2013.01); *H03F 1/483* (2013.01); *H03F 1/486* (2013.01); *H03F 1/56* (2013.01); *H03F 1/565* (2013.01); *H03F 3/195* (2013.01); *H03F 3/213* (2013.01); *H03F 3/245* (2013.01); *H03F 3/60* (2013.01); *H03F 3/601* (2013.01); *H01L 23/49838* (2013.01); *H01L 28/40* (2013.01); *H01L 29/2003* (2013.01); *H01L 2223/6611* (2013.01); *H01L 2223/6655* (2013.01);
(Continued)

(58) Field of Classification Search
CPC .......... H03F 1/0288; H03F 1/56; H03F 3/194; H03F 3/213; H03F 3/60; H01L 23/66
See application file for complete search history.

(56) References Cited

U.S. PATENT DOCUMENTS 9,571,044 B1    2/2017 Zhu et al.
9,768,744 B1 *  9/2017 Arell ................. H03F 1/42
(Continued)

FOREIGN PATENT DOCUMENTS

EP    3160042 A1    4/2017
WO   2009060264    5/2009

OTHER PUBLICATIONS

Wang, Z. and Park, C.-W. (2014), Novel Wideband High-efficiency High-power Amplifier Using Microstrip Radial Stub for 4G Communication Systems. Microw. Opt. Technol. Lett., 56: 1412-1418.
(Continued)

*Primary Examiner* — Samuel S Outten

(57) ABSTRACT

An amplifier package may include a transistor, an output impedance matching circuit and one or more radial stub harmonic traps coupled to a control terminal of the transistor or to an output terminal of the transistor. The output impedance matching circuit and the radial stub harmonic traps may be formed on a single substrate or separate substrates, which may be formed from gallium nitride. Each radial stub harmonic trap may provide a low resistance path to ground for signal energy above a fundamental operating frequency of the amplifier, such as harmonic frequencies thereof.

18 Claims, 9 Drawing Sheets

(51) Int. Cl.
*H03F 1/48* (2006.01)
*H03F 3/24* (2006.01)
*H03F 1/56* (2006.01)
*H01L 23/66* (2006.01)
*H03F 3/213* (2006.01)
*H03F 3/60* (2006.01)
*H01L 23/498* (2006.01)
*H01L 49/02* (2006.01)
*H01L 29/20* (2006.01)

(52) U.S. Cl.
CPC .. *H03F 2200/222* (2013.01); *H03F 2200/255* (2013.01); *H03F 2200/36* (2013.01); *H03F 2200/387* (2013.01); *H03F 2200/423* (2013.01); *H03F 2200/451* (2013.01)

(56) References Cited

U.S. PATENT DOCUMENTS

| | | | |
|---|---|---|---|
| 2009/0309662 A1* | 12/2009 | Yang | H01L 23/66 330/295 |
| 2011/0169576 A1 | 7/2011 | Okuda | |
| 2012/0154053 A1 | 6/2012 | Blair | |
| 2013/0001662 A1* | 1/2013 | Nishijima | H03F 1/56 257/296 |
| 2013/0033325 A1 | 2/2013 | Ladhani et al. | |
| 2015/0365057 A1 | 12/2015 | Kaczman | |
| 2016/0173039 A1 | 6/2016 | Frei et al. | |
| 2016/0344353 A1 | 11/2016 | Watts et al. | |
| 2017/0034913 A1* | 2/2017 | Mu | H05K 1/111 |
| 2018/0159479 A1 | 6/2018 | Wu et al. | |
| 2018/0175799 A1 | 6/2018 | Wu et al. | |
| 2018/0175811 A1 | 6/2018 | Canning et al. | |

OTHER PUBLICATIONS

Non Final Office Action; U.S. Appl. No. 15/832,381; 19 pages (dated Jun. 6, 2019).

Notice of Allowance: U.S. Appl. No. 15/832,381 18 pages (dated Nov. 20, 2019).

* cited by examiner

AMPLIFIERS WITH IN-PACKAGE RADIAL STUB HARMONIC TRAPS

CROSS-REFERENCE TO RELATED APPLICATION(S)

This application is a continuation of U.S. patent application Ser. No. 15/832,381, titled "Wideband Power Amplifiers with Harmonic Traps," filed Dec. 5, 2017, the entire contents of which is incorporated herein by reference.

TECHNICAL FIELD

Embodiments of the subject matter herein relate generally to packaged semiconductor devices, and more particularly to packaged, radio frequency (RF) semiconductor devices with impedance matching circuits that include harmonic traps to potentially enhance performance.

BACKGROUND

A typical high power, radio frequency (RF) semiconductor device may include one or more input leads, one or more output leads, one or more transistors, bond-wires coupling the input lead(s) to the transistor(s), and bond-wires coupling the transistor(s) to the output lead(s). The bond-wires have inductive reactance at high frequencies, and such inductances are factored into the design of input and output impedance matching circuits for a device. In some cases, input and output impedance matching circuits may be contained within the same package that contains the device's transistor(s). More specifically, an in-package, input impedance matching circuit may be coupled between a device's input lead and a control terminal (e.g., the gate) of a transistor, and an in-package, output impedance matching circuit may be coupled between a current conducting terminal (e.g., the drain) of a transistor and a device's output lead.

In the field of amplifier design, it is becoming necessary to perform concurrent multi-band, broadband amplification. In order to successfully design a wideband Doherty Power Amplifier (PA) for concurrent multi-band, broadband operation, it is necessary to enable a good broadband fundamental match, to handle harmonic frequency interactions, and to enable a wide video bandwidth (VBW). The handling of harmonic frequency interactions at the input and output impedance matching networks of a PA becomes especially important for gallium nitride (GaN)-based Doherty PAs. In particular, frequency dispersion introduced across the harmonic band of a Doherty PA results in (i) increased sensitivity of interactions between the fundamental match impedance and harmonic termination, and (ii) the optimum fundamental load at the output of the PA no longer being constant, which effectively limits the PA bandwidth. Hence there is a pressing need to develop broadband harmonic termination.

DESCRIPTION OF THE DRAWINGS

A more complete understanding of the subject matter may be derived by referring to the detailed description and claims when considered in conjunction with the following figures

DETAILED DESCRIPTION

Figure 1:
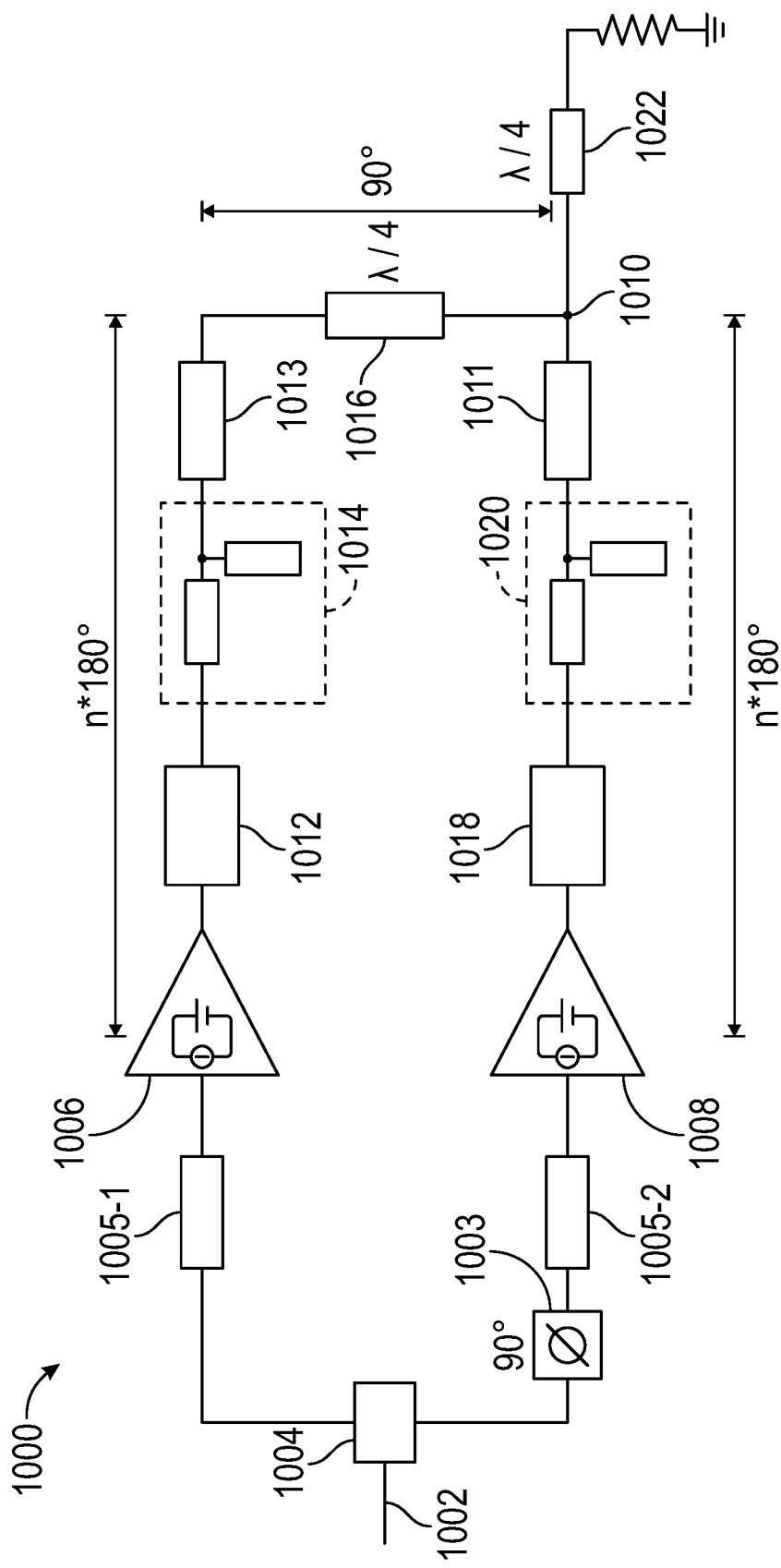
FIG. 1 is a block diagram illustrating a conventional Doherty amplifier architecture and illustrating total phase shift between the device's carrier amplifier and summing node.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

The present disclosure relates to input and output impedance matching circuitry for amplifiers, specifically, for inverted and non-inverted Doherty power amplifiers (PAs). In particular, frequency dispersion introduced across the harmonic band of a Doherty PA can result in (i) increased sensitivity of interactions between the fundamental match impedance and harmonic termination, and (ii) the optimum fundamental load at the output of the PA no longer being constant, which effectively limits the PA bandwidth.

Embodiments of the present invention may be particularly beneficial for GaN based Radio Frequency (RF) PA solutions. Harmonically tuned PAs exhibit high operating efficiencies compared to a traditional class-B amplifier design in which all harmonic frequencies are terminated with a short. Gallium Nitride (GaN) transistors inherently have higher power densities than most other transistor variants. Thus, the effective drain-source capacitance $C_{ds}$ of a GaN transistor, compared to transistor variants having lower power densities, may be lower, which may provide more flexibility to engineer harmonic termination external to the GaN transistor. By manipulating harmonic impedances, the optimum impedance within a fundamental operating frequency band of the GaN transistor may vary. In other words, the low effective drain-source capacitance $C_{ds}$ intrinsic to GaN transistors may sensitize harmonic terminations to the output impedance matching network of a PA that includes a GaN transistor. This sensitization may provide a potential challenge in designing wideband PAs using GaN transistors.

Narrowband resonant circuits (e.g., low-pass L-C circuits) may be incorporated in an amplifier circuit to enable harmonic termination, but tend to have dispersive behavior across wide frequency bandwidths. This frequency dispersion introduced across the harmonic frequency band (i) increases the sensitivity of fundamental match interacting with the harmonic termination(s) and vice versa, and (ii) causes the optimum fundamental load at the current generator across the fundamental frequency band to no longer be constant, which may limit the frequency bandwidth of the PA.

Frequency dispersion refers to the property of high frequency transmission lines that have different group velocity versus frequency. Group dispersion refers to the velocity with which the shape of a signal's amplitude propagates through space. Frequency dispersion generally occurs in non-Transverse Electro-Magnetic (TEM) transmission lines such as waveguide and microstrip transmission lines. For wideband signals, this frequency dispersion introduces non-uniform transmission line impedance.

As described below, the negative effects of this frequency dispersion across a wide harmonic band of an amplifier's inputs and outputs can be mitigated by the harmonic traps of the present invention. Additionally, broadband fundamental matching and wide Video Bandwidth (VBW) are achieved using a shunt-L matching topology that embodies a (RF) cold point in combination with these harmonic traps. The shunt-L matching topology may be a shunt-L pre-match that serves to at least partially compensate for the impedance lowering effect of low $C_{ds}$ that is intrinsic to GaN transistors. The shunt-L pre-match may also reduce the total electrical length of the output impedance matching circuit of the amplifier.

Another challenge that is specific to GaN power devices (e.g., inclusive to GaN transistors) is that GaN power devices have an inherently higher power density compared to, for example, Laterally Diffused Metal Oxide Semiconductor (LDMOS) power device. Thus, for a GaN power device and a LDMOS power device, each having an equivalent output power rating, the required value of shunt-L inductance will generally be higher for the GaN power device. For a GaN power device to achieve a high VBW, baseband currents at baseband frequencies (e.g., DC to 1.5 GHz) generated at an output conducting terminal of the GaN power device must see a low impedance path to ground. Any non-zero impedance seen by the output conducting terminal within the baseband frequency range will generate associated baseband voltage products that may act as unwanted memory vectors. A low impedance path to ground at baseband frequencies (e.g., via a baseband termination circuit) will minimize the generation of these unwanted memory voltage terms.

For GaN power devices, high shunt-L pre-match inductance may be an important consideration given that baseband currents generated at the output conducting terminal of the power device must first flow through the shunt-L pre-match inductance prior to flowing through the baseband termination circuit to ground. As a result, the high value of shunt-L pre-match inductance that may be required to implement a GaN-based solution may raise the overall baseband impedance seen at the output conducting terminal of the GaN power device even if the baseband termination circuit connected to ground at the RF cold point otherwise provides a low impedance path to ground at baseband frequencies. Put another way, shunt-L pre-match inductance may set a minimum limit on attainable baseband frequency range impedance. Shunt-L pre-match inductance may reduce the effectiveness of the overall baseband termination circuit and this effect may be more pronounced for GaN power devices. Furthermore, the effective baseband impedance seen by the output conducting terminal of the GaN power device is also influenced by the series output inductance associated with, for example, bond wires coupling the output conducting terminal of the GaN power device to the output lead of the GaN power device together with any shunt inductive path formed by subsequent circuitry such as inductances associated with any bias feed elements. The limit to which baseband impedances seen by the output conducting terminal of the GaN power device may be reduced is set by the parallel combination of the shunt-L pre-match inductance together with any series output path inductance plus subsequent shunt inductance associated with bias feed circuitry.

Given that the ability to minimize the series inductance associated with the amplifier output path plus the subsequent shunt inductance associated with bias feed circuitry may be limited by practical design considerations, for a GaN power device it may be necessary to minimize the required value of shunt-L pre-match inductance to ensure sufficiently wideband, low baseband impedance seen by the output conducting terminal of the device. By implementing a wideband harmonic termination across $C_{ds}$, the additive capacitance of the wideband harmonic termination(s) increases overall equivalent output capacitance in the fundamental RF frequency range allowing a lower value of shunt-L pre-match inductance to be implemented. Furthermore, by providing a wideband harmonic termination, embodiments of the present disclosure may reduce the need for a high series inductance in the amplifier output path that may otherwise be required to minimize harmonic termination dispersion. This reduction of series inductance in the output path may further benefit baseband impedance seen by the output conducting terminal of the GaN power device.

In addition to these benefits to baseband impedance, the combination of harmonic termination, shunt-L pre-match, and reduced series inductance in the output path all contribute to providing a wider bandwidth at the fundamental operating frequency as well as minimizing the electrical length for the fundamental frequency impedance matching circuit that provides ability to realize minimum-phase or inverted Doherty by constraining the phase of the output network from the current generator to Doherty combiner node to 90 degrees.

A brief, general description of the operating principles of an idealized, classical Doherty amplifier is now provided to add context to some of the terminology used in this disclosure. As known, a classical Doherty amplifier has two amplifying devices arranged in parallel. For sake of simplicity this description will consider the case of a symmetric Doherty amplifier where the two amplifying devices are of the same power capability although it is understood that the two devices may be of different power capability as is the case in an asymmetric Doherty amplifier. The first one of the devices (main or carrier stage) operates in a class-AB amplifier mode and the second one (peak stage) operates in a class-C amplifier mode. These devices are separated at their inputs and at their outputs by 90° phase-shifting networks. The output phase-shifting network has a specific characteristic impedance $Z_0$ which may be equal to the optimal load line impedance $RL_m$ of the main stage. The input signal is split so as to drive the two amplifiers, and a summing network, known as an "impedance inverter" or a "Doherty combiner", is operative to: a) combine the two output signals, and b) to provide an inverted impedance at the output of the Doherty amplifier with respect to the impedance as seen from the output of the main stage. While the Doherty input power level stays below 0.25 of the maximum (or: 6 decibels (dB) below maximum) the peak stage remains inactive, referred to herein as the "power back-off" operating point of the Doherty amplifier, due to the impedance inversion, the main stage operates at load, which is two times higher than the optimal load line impedance equal to $2RL_m$. This may allow for higher power efficiency of the main stage, and also of the Doherty amplifier. The double load at the output of the main stage is possible at proper arrangement of the output load $RL_D$ of the Doherty amplifier which, for the classical case, is $RL_D = \frac{1}{2}Z_0 = \frac{1}{2}RL_m$ and which is transformed by the output phase-shifting network to $2Z_0 = 2RL_m = 4RL_D$. When the input signal to the Doherty amplifier achieves a certain power level, which is 6 dB below the peak power level for a classical Doherty amplifier, the output voltage of the main stage reaches the maximum radio frequency (RF) voltage amplitude resulting in maximum power efficiency and then the peak stage is activated and contributes to the amplification. Above this threshold power level or power back-off operating point, the load impedance as seen by the main stage starts to drop gradually with growing power level until it reaches its optimal value $RL_m=Z_0$, which occurs at the peak power level of the Doherty amplifier.

FIG. 1 is a block diagram illustrating a conventional Doherty amplifier architecture and showing total phase shift between the device's carrier amplifier and output node. As illustrated, Doherty amplifier 1000 includes, at input 1002, splitter 1004. Splitter 1004 may include a power divider with an input for receiving an input radio frequency signal, and first and second divider outputs. When connected to a symmetrical Doherty amplifier, splitter 1004 may divide or split an input signal received at input 1002 into two signals that are very similar with, in some embodiments, equal power. In other cases, though, splitter 1004 may output signals having unequal power. Input splitter 1004 may also apply a relative phase shift between first and second splitter outputs. For example, input splitter 1004 may provide about a 90 degree relative phase delay to the RF signal output to the peaking path in FIG. 1 so that that carrier and peaking path RF signals at output combining node 1010 may be received in phase. This phase shift is represented by phase shifter 1003.

The outputs of splitter 1004 are coupled to carrier amplifier 1006 and peaking amplifier 1008 through input matching networks 1005-1 and 1005-2, respectively. Amplifiers 1006 and 1008 each may include a respective single transistor or, alternatively, may include a respective system of components including multiple transistors. As will be appreciated by those of ordinary skill based on the description herein, carrier amplifier 1006 and peaking amplifier 1008 may include one or more stages of relatively low power level amplification and relatively high power level amplification. In some embodiments, carrier amplifier 1006 may be implemented by a network of electrical components, in which case, carrier amplifier 1006 may include an active device, which is often modeled as a current source (depicted on FIG. 1 as a current source within carrier amplifier 1006). Peaking amplifier 1008 may be similarly implemented. The output of carrier amplifier 1006 is connected to output combining node 1010 through a carrier path that includes output pre-match circuit 1012, output matching network 1014, delay line element 1013, and impedance inverter element 1016. The output of peaking amplifier 1008 is connected to output node 1010 through a peaking path that includes output pre-match circuit 1018, output matching network 1020, and delay line element 1011. The carrier path may have a 270° phase length, while the peaking path may have a 180° phase length, in some embodiments. In some embodiments, output pre-match circuits 1012 and 1018 may include or instead be harmonic terminations (HT). An impedance network, represented by element 1022 operates to present the proper load impedances to each of carrier amplifier 1006 and peaking amplifier 1008. In a real-world implementation, element 1022 may be replaced by a suitably configured transmission line or impedance transformer, where the transmission line or impedance transformer has an impedance selected to match the impedance of amplifier 1000 to the desired loads over the operating dynamic range of the Doherty amplifier. Carrier amplifier 1006 may be considered as a current generator for pre-match circuit 1012 and output matching network 1014. Similarly, peaking amplifier 1008 may be considered as a current generator for pre-match circuit 1018 and output matching network 1020.

Figure 2:
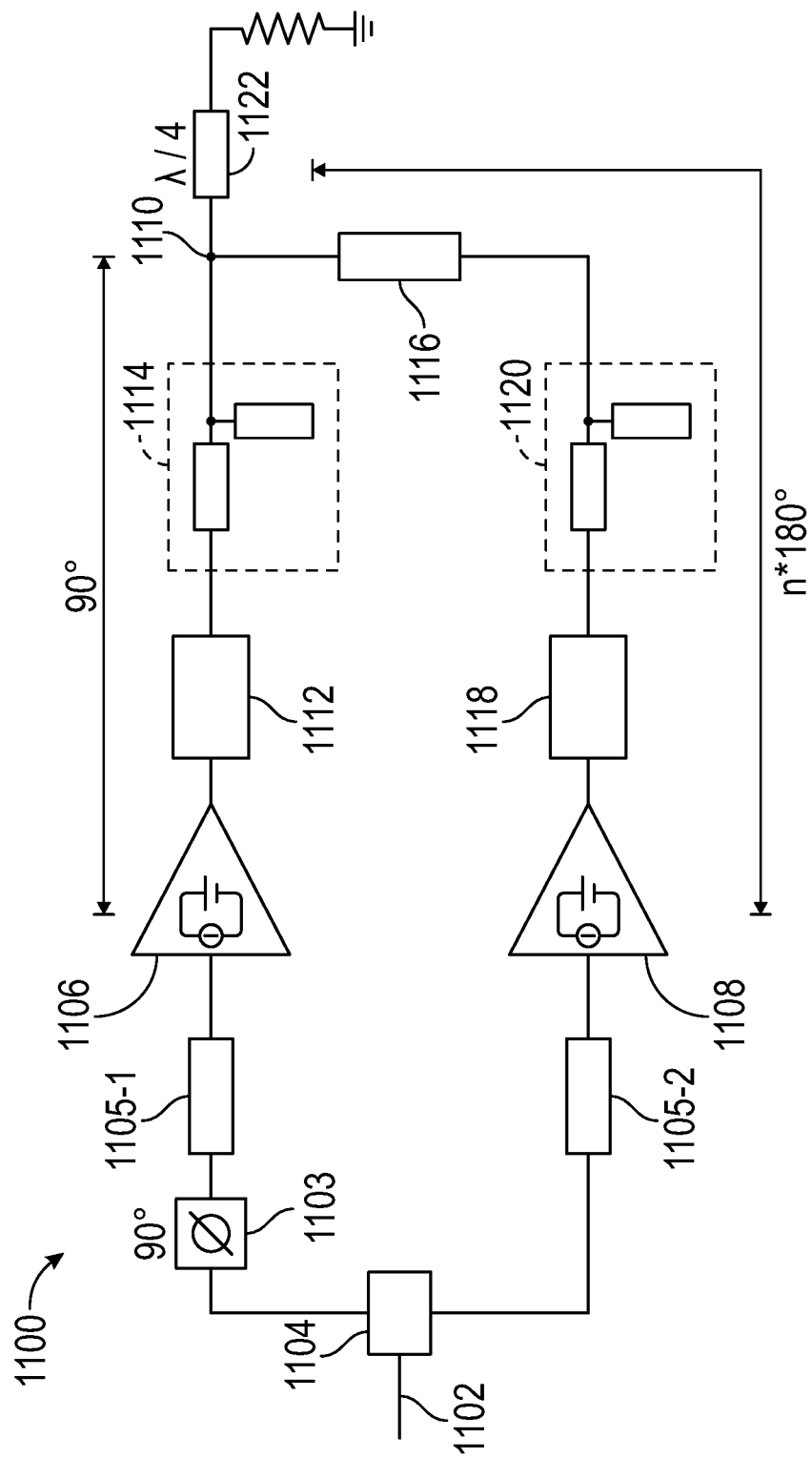
FIG. 2 is a block diagram illustrating the amplifier of FIG. 1 with components rearranged in an inverted Doherty amplifier architecture.

In contrast to FIG. 1, FIG. 2 shows the amplifier of FIG. 1 with components rearranged in an inverted Doherty amplifier architecture. In FIG. 2, the inverted Doherty amplifier 1100 includes, at input 1102, splitter 1104. The outputs of splitter 1104 are coupled to carrier amplifier 1106 and peaking amplifier 1108 through input matching networks 1105-1 and 1105-2, respectively. Input splitter 1104 may also apply a relative phase shift between first and second splitter outputs. For example, input splitter 1104 may provide about a 90 degree relative phase delay to the RF signal output to the carrier amplifier path in FIG. 1 so that that carrier and peaking path RF signals at output combining node 1110 may be received in phase. This phase shift is represented by phase shifter 1103. In some embodiments, carrier amplifier 1106 may be implemented by a network of electrical components, in which case, carrier amplifier 1106 may include an active device, which is often modeled as a current source (depicted on FIG. 2 as a current source within carrier amplifier 1106) in parallel with a parasitic drain-to-source capacitance value $C_{ds}$. Peaking amplifier 1108 can be similarly implemented. The output of carrier amplifier 1106 is connected to output combining node 1110 through a carrier path that includes output pre-match circuit 1112 and output matching network 1114. The output of peaking amplifier 1108 is connected to output combining node 1110 through a peaking path that includes output pre-match circuit 1118, output matching network 1120, and phase delay element 1116. The carrier path has a 90° phase length, while the peaking path has a 180° phase length, in an embodiment. An impedance network, represented by element 1122 operates to present the proper load impedances to each of carrier amplifier 1106 and peaking amplifier 1108 over the operating dynamic range of the Doherty amplifier. Carrier amplifier 1106 may be considered as a current generator for pre-match circuit 1112 and output matching network 1114. Similarly, peaking amplifier 1108 may be considered as a current generator for pre-match circuit 1118 and output matching network 1120.

In Doherty amplifier design, the phase length from the current source of the amplifier's carrier amplifier (e.g., carrier amplifier 1006 or carrier amplifier 1106) to the amplifier's output node should have a total electrical length of $n*\lambda/4$ where n is an odd integer (e.g., to achieve a 90 degree or 270 degree phase length when n=1 or n=3, respectively). Put another way, the carrier path output may behave as a voltage source at the output combining node. In an ideal amplifier, the phase length may be as short as possible, or $\lambda/4$ (i.e., 90 degrees). By reducing the phase length of an amplifier path, that path may require less physical size and expense to implement, and may provide maximum RF bandwidth at the power back-off operating point of the Doherty amplifier.

For the peaking path output, the required phase length is n*180° where n=0, 1, 2, etc. This is so that, in accordance with Doherty amplifier operating principles, the peaking path output may behave as a current source. This also may minimize RF leakage from the carrier path into the peaking path at the power back-off operating condition. In many cases, especially for high power Doherty amplifiers, n=0 may be difficult to realize in practice and n=1 may be a generally preferred solution. For some solutions n=2 may provide certain benefits, but may require a physically larger circuit and may be generally more expensive to implement.

The amplifiers, input networks, and output networks described below in connection with FIGS. 3-10 may each be implemented as part of a Doherty amplifier system such as the Doherty amplifier 1000 shown in FIG. 1 or the inverted Doherty amplifier 1100 shown in FIG. 2.

Figure 3:
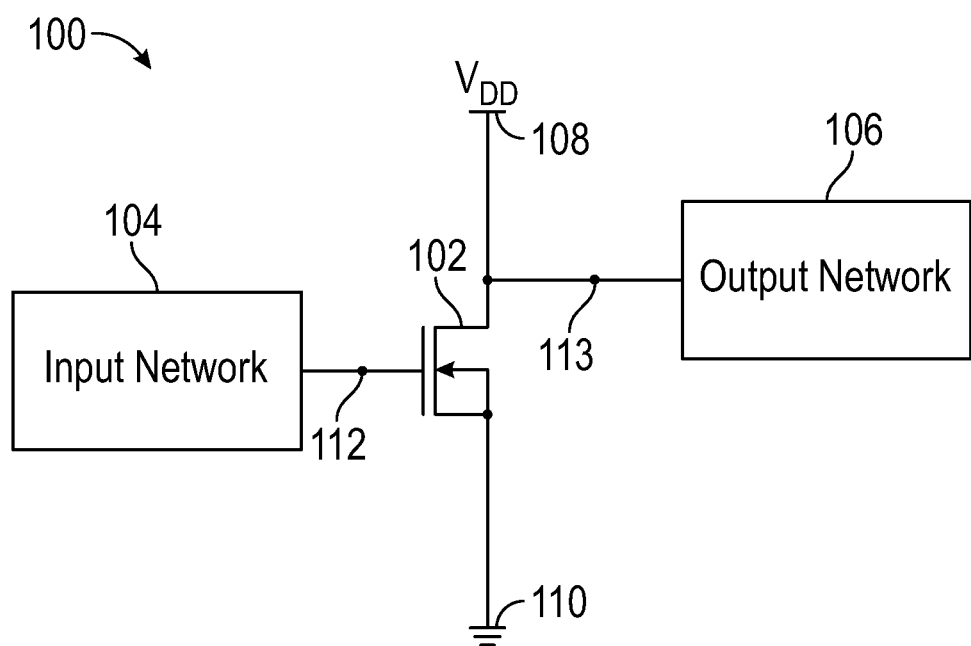
FIG. 3 is a block diagram of an illustrative amplifier path that includes an amplifier having an input network and an output network.

FIG. 3 shows a block diagram of amplifier circuitry 100 that includes a transistor 102 having a gate, a drain, and a source, an input matching network 104 coupled to the gate of transistor 102, an output matching network 106 coupled to the drain of transistor 102, a voltage source 108 that provides a voltage Vdd at the drain of transistor 102, and a ground 110 that provides a ground voltage at the source of transistor 102. It should be noted that transistor 102 may be considered to have gate, drain, and source terminals for instances in which transistor 102 is a Field Effect Transistor (FET). For instances in which transistor 102 is a Bipolar Junction Transistor (BJT), transistor 102 may instead have base, collector, and emitter terminals. The base or gate of transistor 102 may be sometimes referred to herein as an input node or a control terminal of transistor 102. The drain or collector of transistor 102 may sometimes be referred to herein as an output node or output terminal of transistor 102. If desired, ground 110 may be replaced with another, non-ground, voltage reference. In practice, ground 110 may be a ground-plane formed from part of a conductive housing of a package in which amplifier circuitry 100 is contained. Amplifier circuitry 100 may be part of a larger amplifying circuit, such as Doherty amplifier 1000 of FIG. 1 or inverted Doherty amplifier 1100 of FIG. 2. For example, transistor 102 could be a peaking amplifier such as peaking amplifier 1008 shown in FIG. 1 and peaking amplifier 1108 shown in FIG. 2, or could be a carrier amplifier such as carrier amplifier 1106 shown in FIG. 1 and carrier amplifier 1106 shown in FIG. 2.

Input matching network 104 may be connected to external input circuitry (not shown) that provides signals to be amplified by transistor 102 to input matching network 104. Input matching network 104 may be configured to match the impedance at an input of input matching network 104 (e.g., the impedance of the external input circuitry) to the impedance of an output of input matching network 104 (e.g., the impedance of the gate of transistor 102) while filtering out unwanted noise in order to effectively reduce or eliminate any signal noise/reflection/standing waves that would otherwise occur at the gate of transistor 102. Unwanted noise filtered out by input matching network 104 may include undesirable signal energy at harmonic frequencies.

Output matching network 106 may be connected to external output circuitry (not shown) and may provide amplified signals from transistor 102 to the external output circuitry. Output matching network 106 may be configured to match the impedance at an input of output matching network 106 (e.g., the impedance at the drain of transistor 102) to the impedance of an output of the output matching network (e.g., the impedance of the external output circuitry) while filtering out unwanted noise in order to effectively reduce or eliminate any signal noise/reflection/standing waves that would otherwise occur at the output of transistor 102. Unwanted noise filtered out by output matching network 106 may include undesirable signal energy at harmonic frequencies.

Transistor 102 may be any desired type of transistor such as a Metal Oxide Semiconductor Field Effect Transistor (MOSFET), a High Electron Mobility Transistor (HEMT), or a BJT. Transistor 102 may be fabricated using a compound semiconductor substrate, such as GaN, Gallium Arsenide (GaAs), or Silicon Carbide (SiC), although transistor 102 may be fabricated using other semiconductor substrates, as well. For instances in which transistor 102 is a FET or HEMT, transistor 102 includes a channel connecting the drain terminal to the source terminal that has variable conductivity. The conductivity of this channel is controlled according to the voltage applied at the gate terminal (e.g., control terminal) of transistor 102, and the amount of current allowed to pass from the drain of transistor 102 to the source of transistor 102 is based on the instantaneous conductivity of the channel.

Input signals (e.g., radio frequency (RF) voltage signals) provided to the gate of transistor 102 from input matching network 104 control the amount of current allowed to flow from the drain to the source of transistor 102. Output signals (e.g., RF voltage signals) are generated at the drain of transistor 102 when the conductivity of the channel of transistor 102 is modulated. The output signals are effectively amplified versions the input signals. These output signals are provided to the external output circuitry through output matching network 106.

Harmonic termination circuits or components (e.g., harmonic traps) may be connected to node 112, for example, between the gate of transistor 102 and the input matching network 104. In alternate embodiments, these harmonic termination circuits may instead by connected to node 113 between the drain of transistor 102 and output matching network 106, may be included as part of output matching network 106, or may be included as part of input network 106. Specific embodiments of this harmonic termination are described in greater detail below in connection with FIGS. 4 and 5.

For example, a grounded capacitor may be connected to a signal path to provide a bypass signal path to ground for high frequency signals (e.g., signals that oscillate with a sufficiently high frequency so as to cause the capacitor to act as a short circuit to ground) allowing the high frequency signals to pass to ground rather than to continue along the signal path. As another example, a grounded inductance may be connected to a signal path to provide a bypass signal path to ground for low frequency signals (e.g., signals with no oscillation or signals that oscillate with a sufficiently low frequency so as to cause the inductance to act as a short circuit to ground) allowing the low frequency signals to pass to ground rather than to continue along the signal path.

Figure 4:
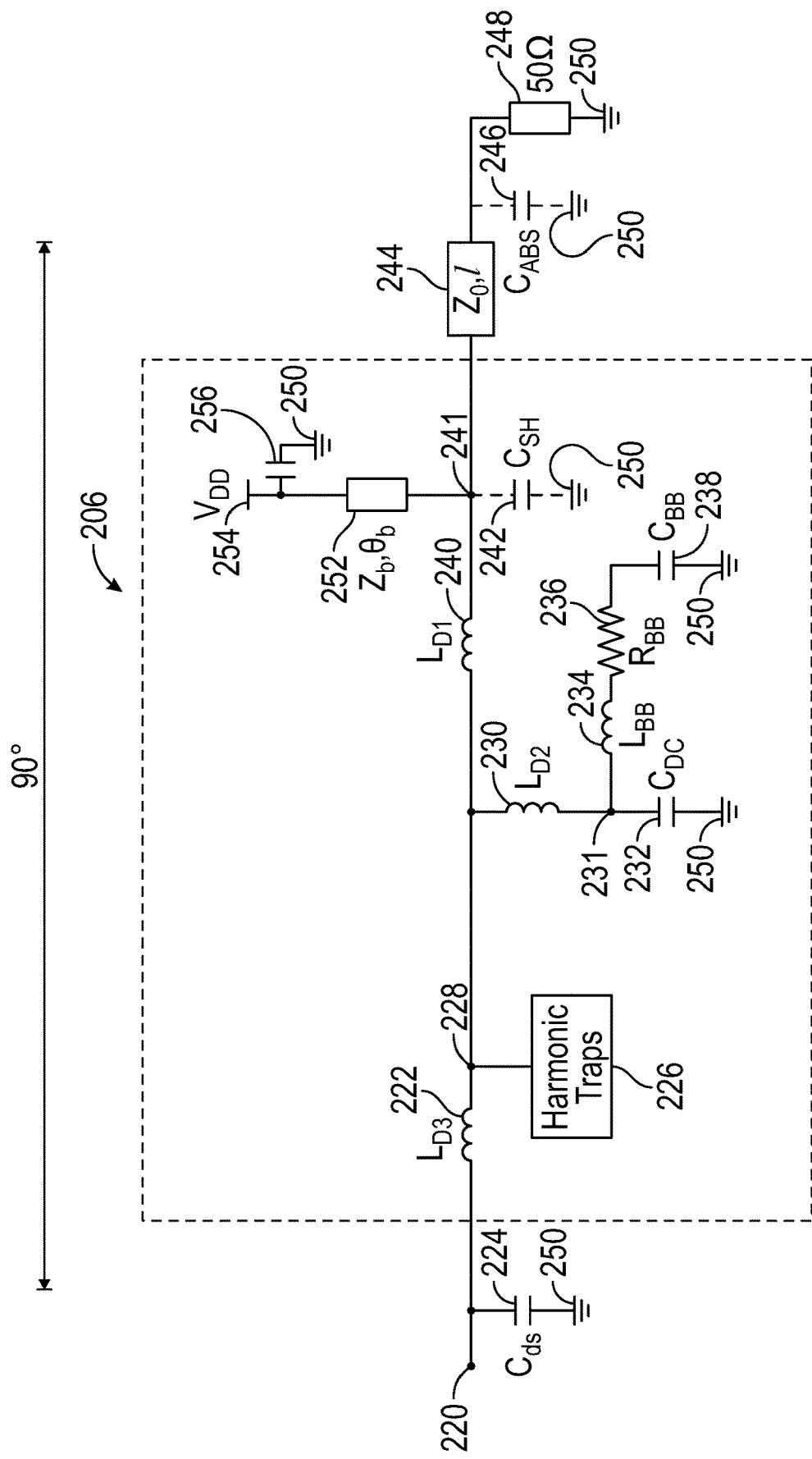
FIG. 4 is a block diagram of an illustrative output path that includes an output network of the type shown in FIG. 3 having a virtual open at a harmonic frequency at its input plane, one or more harmonic traps, a shunt-L pre-match circuit, a baseband impedance circuit, and a variable length drain feeder.

FIG. 4 shows a block diagram of an illustrative output path that includes output network 206, which may correspond to output network 106 shown in FIG. 3 for providing output impedance matching for the drain (i.e., output) of transistor 102. Output network 206 includes a node 220, corresponding to the drain of a transistor, such as transistor 102 shown in FIG. 3. An equivalent drain-source capacitance 224 having a capacitance value $C_{ds}$ is present at node 220. Specifically, while capacitance 224 is shown in the block diagram of FIG. 4, capacitance 224 is not a physical, discrete capacitive component in output network 206, but is instead a representation of intrinsic capacitances observed at the transistor to which output network 206 is connected. Capacitance value $C_{ds}$ corresponds to the generally undesirable parasitic capacitance between the drain, source, and body of the transistor (collector, emitter, and base for instances in which the transistor is a BJT), and should be taken into account when designing RF circuits. An inductance 222 having an inductance value LD3 is coupled between node 220 and a node 228. Inductance value LD3 is selected so that node 220 appears as an open-circuit to signal energy at a second harmonic of a fundamental operational frequency (referred to herein as a fundamental frequency) of the amplifier (e.g., the second harmonic frequency is twice the fundamental frequency). For example, the output network may be tuned to the fundamental frequency. Specifically, node 220 appears as an open-circuit to signal energy at the second harmonic of the fundamental frequency because inductance 222 is designed to have an inductance value LD3 that prevents the passage of frequencies at the second harmonic of the fundamental frequency through inductance 222. In this way, inductance 222 appears as an open circuit through which signal energy at the second harmonic of the fundamental frequency cannot pass, but through which signal energy at comparatively lower frequencies, such as the fundamental frequency itself, can pass.

One or more harmonic traps 226 are coupled to node 228. Each harmonic trap 226 includes a path to ground that may resonate at one or more harmonics of the fundamental frequency within a harmonic frequency band (e.g., ranging from 1200 MHz to 20 GHz) in order to terminate signal energy at these harmonics (e.g., to prevent the signal energy at the harmonics from propagating further through the output network 206). For instances in which multiple harmonic traps 226 are implemented having different respective resonance frequencies, inductance value LD3 may be variable and may be optimized to achieve optimum harmonic termination through harmonic traps 226 (e.g., of multiple harmonics of the fundamental frequency, not just the second harmonic). It should be noted that, while harmonic traps 226 are shown here to be coupled to node 228 as part of output network 206, in other embodiments harmonic traps 226 may instead be coupled to a node (e.g., node 112, FIG. 3) between an input network (e.g., input network 104, FIG. 3) and a control terminal of transistor 102, or may be part of the input network.

An inductance 230 having inductance value LD2 is coupled in series with a capacitor 232 having a capacitance value $C_{DC}$ between node 228 and ground node 250 to form a shunt-L matching topology (herein referred to as shunt-L circuitry). Ground nodes 250 may be a connection to a ground-plane of a package housing (not shown) that contains output network 206 or may be the ground-plane itself. Some or all of the components of output network 206 may be implemented as part of an integrated passive device (IPD). In some embodiments, output network 206 may be contained within the same package housing as the amplifier. In other embodiments, output network 206 may be contained in a package housing that is separate from that of the amplifier. The shunt-L circuitry is designed by selecting values for $L_{D2}$ and $C_{DC}$ that compensate for impedance lowering effects of the source-drain capacitance value $C_{ds}$, which may desirably ensure a good broadband fundamental impedance match for output network 206. It should be noted that the presence of harmonic traps 226 may reduce the inductance value required for the shunt-L inductance value $L_{D2}$. By carefully designing the shunt-L circuitry impedance values, the overall equivalent output capacitance, including $C_{ds}$ and the contribution from the harmonic traps 226, can be resonated out. When correctly designed, the shunt-L circuitry causes output network 206 to act as a reduced frequency dispersion, inverted Doherty power amplifier (PA) compatible architecture suitable for use with a broadband PA. For example, output network 206 may be optimized for use as output pre-match 1112 and output matching network 1114 for carrier amplifier 1106 of inverted Doherty amplifier 1100 shown in FIG. 2.

A low impedance baseband termination is coupled to a node 231 located between inductance 230 and capacitor 232 of the shunt-L circuitry. The low impedance baseband termination includes inductance 234 having inductance value $L_{BB}$, resistor 236 having resistance value $R_{BB}$, and capacitor 238 having capacitance value $C_{BB}$, all coupled in series between node 231 and ground node 250.

By selecting the inductance value $L_{BB}$, resistance value $R_{BB}$, and capacitance value $C_{BB}$ that give the baseband termination low impedance at selected frequencies, and by placing capacitor 238 very close to the active die that includes the transistor (e.g., transistor 102 shown in FIG. 3), the video bandwidth (VBW) of output network 206 may be widened. Node 231 may act as a baseband frequency cold point at frequencies at which the baseband termination has a low impedance (e.g., at baseband frequencies) and may act as an RF cold point at frequencies at which the shunt-L circuit has a low impedance seen from node 231. Baseband frequencies may, for example, include any frequency between DC and 1.5 GHz. A cold point is a node that acts as a virtual ground for signals at selected frequencies. As used here, "virtual ground" refers to a path by which signals (in this case, RF or baseband signals at the selected frequencies) may be routed to ground due to the low impedance between the cold point and the ground-plane (e.g., due to the low impedance of the baseband termination or the low impedance of the shunt-L circuit (specifically capacitor 232)) at the selected frequencies. By connecting the baseband circuit to the RF cold point at node 231 this may minimize RF leakage through the baseband circuit. The values selected for the inductance value $L_{BB}$, resistance value $R_{BB}$, and capacitance value $C_{BB}$ are further chosen so that leakage of RF energy for RF signals oscillating at the fundamental frequency may be minimized. VBW generally refers to the maximum signal bandwidth that an amplifier or transmitter system may process whilst complying with system defined constraints for interference levels.

An inductance 240 having inductance value LD1 is coupled to node 228. A transmission line 244 having characteristic impedance value $Z_0$ and physical length l connects inductance 240 to a load 248 having a 50Ω impedance. It should be noted that the 50Ω impedance shown for load 248 is merely illustrative and any desired load impedance value may be used. The load 248 may also be an active load with variable impedance such as in the case in a Doherty power amplifier where, for example, the load 248 may be represented by the impedance seen by the carrier output path at the combining node in the Doherty power amplifiers depicted in FIGS. 1 and 2.

In practice, inductance 240 may represent a bond-wire connecting an active die on which the transistor 102 is formed to transmission line 244. Transmission line 244 may be entirely or in part an output lead for a package in which the die is housed. The load 248 may be located in an external device that is coupled to the active die through transmission line 244 and inductance 240.

A drain bias (DC bias feeder) transmission line 252 is coupled between voltage source 254 (which provides a voltage $V_{DD}$) and node 241. Node 241 may be considered as an output node of the output matching network 206. The drain bias transmission line 252 has characteristic impedance $Z_b$ and electrical length $\theta_b$. Capacitor 256 is coupled between voltage source 254 and ground node 250. Parameters of drain bias transmission line 252, $Z_b$ and $\theta_b$, may be variable parameters. For a given time, $\theta_b$ may, for example, be equal to a $2\pi*l/\lambda$, where l is the physical length of drain bias transmission line 352 and where $\lambda$ is equivalent to one wavelength of a signal passing through line 252 at the fundamental operating frequency of the amplifier. The drain bias transmission line 252 may add further flexibility to the overall matching network. For example, if we assume that transmission line 244, in part, includes an output lead for a packaged device and further assume that the capacitance of the output lead exceeds a desired value of $C_{SH}$, then the electrical length of transmission line 252, $\theta_b$, may be adjusted (<90°) so that transmission line 252 represents an inductance in parallel with this capacitance. This may reduce the overall effective capacitance located between inductance 240 and transmission line 244 allowing a desired capacitance value to be attained for $C_{SH}$.

Optionally, a shunt capacitor 242 having capacitance value $C_{SH}$ may be coupled between inductance 240 and transmission line 244. In order to create a match with very low frequency dispersion, the values of the impedance $Z_0$ and physical length l of the transmission line 244 and the capacitance value $C_{SH}$ may be optimized to (i) match the impedance of load 248 to the load-line match at the drain (e.g., output node) of the transistor, (ii) sustain 90 degree electrical delay between node 220 and the output of transmission line 244, and (iii) extend the range of inductance values that can be selected for the inductance 240.

Instead of including shunt capacitor 242 in output network 206, another shunt capacitor 246 having capacitance value CABs may be coupled between the output of transmission line 244 and the input of load 248 to achieve similar effects mentioned above in connection with capacitor 242, although without the same extension of the range of inductance values for inductance 240. Capacitors 242 and 246 are indicated as optional and/or interchangeable and which of these capacitors is implemented depends on the inductance value LD1 of inductance 240 and the desired impedance transformation ratio of the entire output matching network. For specific inductance values of inductance 240 (that if circumstances allow may be controlled by design) both capacitors 242 and 246 may be omitted which may provide a beneficial reduction in circuit losses and component count for designs of output network 206.

Figure 5:
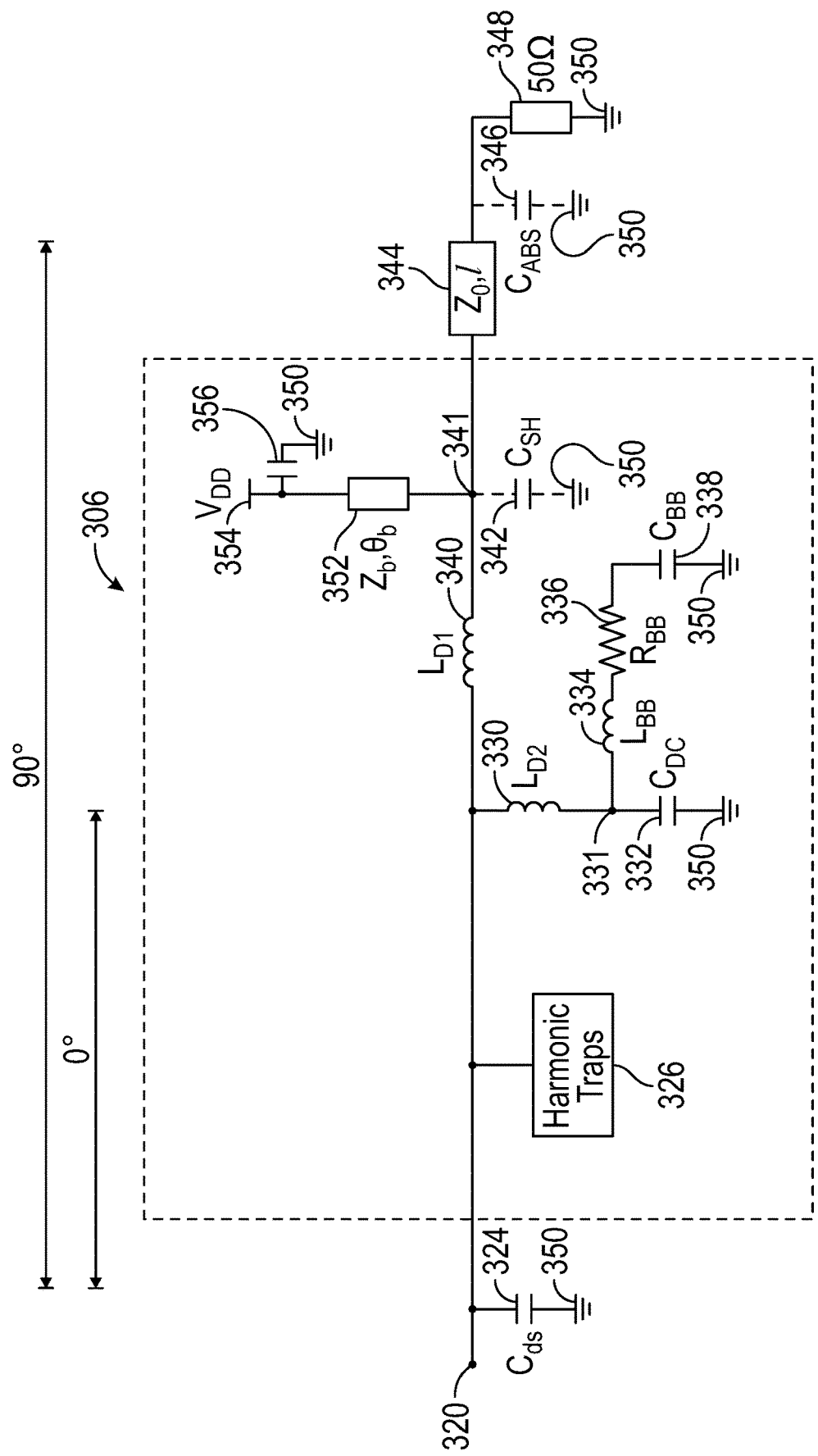
FIG. 5 is a block diagram of an illustrative output path that includes an output network of the type shown in FIG. 3 having a virtual short at one or more harmonic frequencies at its input plane, one or more harmonic traps, a shunt-L pre-match circuit, a baseband impedance circuit, and a variable length drain feeder.

FIG. 5 shows a block diagram of an illustrative output path that includes output network 306, which may correspond to output network 106 shown in FIG. 3. The output path includes a node 320, a drain-source capacitance 324 having a capacitance value $C_{ds}$, one or more harmonic traps 326, an inductance 330 having inductance value LD2, a capacitor 332 having capacitance value $C_{DC}$, an inductance 334 having inductance value $L_{BB}$, a resistor 336 having resistance value $R_{BB}$, a capacitor 338 having capacitance value $C_{BB}$, an inductance 340 having inductance value LD1, an optional shunt capacitor 342 having capacitance value $C_{SH}$, a drain bias (DC bias feeder) transmission line 352 having characteristic impedance $Z_b$ and electrical length $\theta_b$, a transmission line 344 having characteristic impedance $Z_0$ and physical length l, an optional capacitor 346 having capacitance value CABs, a load 348 having, for example, a 50Ω impedance, and multiple ground nodes 350. For example, ground nodes 350 may correspond to a single ground-plane forming a portion of a package housing in which some or all of output network 306 is contained. Some or all of the components of output network 306 may be implemented as a part of an integrated passive device (IPD). In some embodiments, output network 306 may be contained within the same package housing as the amplifier. In other embodiments, output network 306 may be contained in a package housing that is separate from that of the amplifier. The 50Ω impedance of load 348 described above is merely illustrative. This load impedance may be any value and, as in the case of the Doherty amplifier, may be a dynamic load impedance.

The drain bias transmission line 352 is coupled between voltage source 354 (which provides a voltage $V_{DD}$) and node 341. Node 341 may be considered as an output node of the output matching network 306. Capacitor 356 is coupled between voltage source 354 and ground node 350. Parameters of drain bias transmission line 352, $Z_b$ and $\theta_b$, may be variable parameters. For a given time, $\theta_b$ may, for example, be equal to a $2\pi*l/\lambda$, where l is the physical length of drain bias transmission line 352 and where $\lambda$ is one wavelength of a signal passing through line 352 at the fundamental operating frequency of the amplifier.

The output path may be structurally similar to the output path shown in FIG. 4, with the exception of the omission of an inductor (e.g., inductance 222 shown in FIG. 4) between node 320 and the input of harmonic traps 326. Structures and functions of output network 306 that have already been described above in connection with output network 206 are not described again in detail here for the sake of brevity.

Because inductance 222 is not present in the output network of FIG. 3, it can become easier to achieve an ideal 0° insertion phase between node 320 and the shunt-L circuitry (e.g., at inductance 330). This may be viewed as the current generator at node 320 (e.g., the current generator of the carrier amplifier 1106 shown in FIG. 2) being transformed to a virtual current generator at the node connecting to the shunt-L circuitry. Therefore, because it may be easier to minimize the electrical length from node 320 to the node connecting to the shunt-L circuitry, it also can become easier to achieve a total 90° fundamental match phase length (i.e., insertion phase) between node 320 and the output of the transmission line 344 in output network 306. A 90° insertion phase can be desirable for matching a load to a wideband inverted Doherty PA, such as an inverted Doherty amplifier 1100 shown in FIG. 2. Compared to the conventional Doherty amplifier of FIG. 1 there may no longer be a need for the additional delay transmission line 1013 and the discrete impedance inverter 1016. By removing these elements, the resulting output network is effectively 180° shorter than the output network required for the conventional Doherty amplifier of FIG. 1 and this may increase the bandwidth of the Doherty amplifier at the low power back-off operating condition. Furthermore, removal of these elements may reduce circuit losses and size of the overall output network. By having a 90° insertion phase, the output network 306 serves the function of not only an impedance matching network, but also of an impedance inverter. In particular, the 90° insertion phase causes output network 306 to have an input impedance that is inversely proportional to the load impedance. It should be noted that establishing the ideal 0° phasing condition between node 320 and the shunt-L circuit is not the only design consideration required to establish a total output network insertion phase of 90° between node 320 and the output of the transmission line 344. Whilst establishing this condition may make it easier to meet the required total output network insertion phase of 90°, the value of transmission line parameters 344 Z0, L, optional capacitors $C_{SH}$ or $C_{ABS}$, the parameters of DC bias feeder 352, Zb, θb, as well as the total output network impedance transformation ratio that is dictated by the target load line impedance required at node 320 and the target value of load 350 all may be considered in the final design. As discussed previously $C_{SH}$ and $C_{ABS}$ are considered interchangeable and/or optional. Depending on circuit parameters such as total equivalent output capacitance, the value of LD1 and the impedance transformation ratio of the entire output network, it may in some instances be most appropriate to utilize CABs whilst omitting $C_{SH}$ to attain a total 90° insertion phase whilst importantly also providing a solution with maximum RF bandwidth. In other cases, it may be appropriate to utilize $C_{SH}$ whilst omitting CABs to attain the same goals. It may also be appropriate in some instances to incorporate both $C_{SH}$ and $C_{ABS}$ to attain a fully optimized solution. Furthermore, certain design circumstances may dictate that neither $C_{SH}$ nor CABs are appropriate to obtain an optimal solution, but instead shunt inductance is required to offset the presence of excess parasitic capacitance that may for example exist due to capacitance associated with a package lead constituting a portion of transmission line element 344. Such inductance may be implemented by adjusting the parameters of the DC bias feeder transmission line 354, Zb and θb. In all cases the parameters of transmission line 344, Z0, L, are also variables in the overall network optimization design process.

Figure 6:
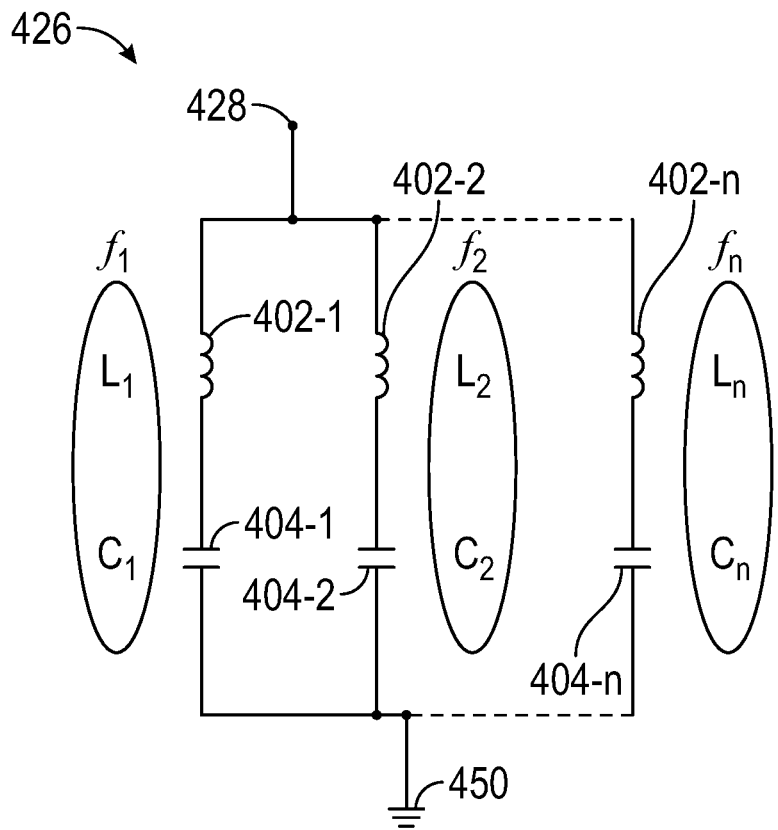
FIG. 6 is a diagram of an illustrative harmonic trap circuit of the type shown in FIGS. 4 and 5 having multiple discrete inductor-capacitor (LC) circuits that may be coupled in parallel with one another and that may each exhibit resonance around a respectively different resonance frequency.

For output network 306, the inductance value $L_{D2}$ may be determined based on capacitance values $C_{ds}$, $C_{DC}$, and the effective capacitance of the harmonic trap network 326 at the fundamental frequency band of operation. Referring to an embodiment of a harmonic trap network shown in FIG. 6 the effective capacitance of the harmonic trap network may be calculated from the values of $L_1$, $L_2$, ..., $L_n$ and $C_1$, $C_2$, ..., $C_n$. In order to simplify the following description, the harmonic trap network 326 may be reduced to a single LC network (e.g., a second harmonic frequency trap) that resonates at the second harmonic frequency of the fundamental frequency (e.g., capacitance value $C_1$ and inductance value $L_1$ as shown in FIG. 6). The inductance value $L_1$ is defined as a function of capacitance value $C_1$ and the second harmonic frequency. The calculation for determining the inductance value $L_{D2}$ is therefore as follows:

$$C_{eq} = \left[ C_{ds} + \frac{C_1}{1 - \omega_0^2 \cdot L_1 C_1} \right]$$

$$L_{D2} = \frac{1}{\omega_0^2} \left[ \frac{C_{eq} + C_{DC}}{C_{eq} \cdot C_{DC}} \right]$$

In the above equations, $\omega_0$ represents $2\pi f_0$, where $f_0$ is the fundamental resonance frequency for the portion of the output network including $C_{ds}$, harmonic trap 326 and the shunt-L circuit, and $C_{eq}$ represents the equivalent capacitance of the source-drain capacitance 324 combined with the effective capacitance of the second harmonic frequency trap. Of note is that the choice of fundamental resonance frequency $f_0$ ($\omega_0$) is dependent on the application at hand and other practical considerations that may need to be accounted for in the design. For example, $f_0$ may be chosen to be the center frequency of a given fundamental frequency band of operation of an amplifier (e.g., corresponding to amplifier path 100, FIG. 3) or $f_0$ may be set at some other frequency within the fundamental frequency band or even below the fundamental frequency band depending on practical design considerations for the overall solution. The fundamental frequency band may, for example, range anywhere from 600 MHz and 5 GHz. A further observation from the above design equations is that the resulting increase in equivalent capacitance value Ceq, due to harmonic trap 326 reduces the required inductance value of LD2 330 for a given fundamental resonance frequency, $f_0$. Inductance value LD2 together with inductance value LD1 set a limit on attainable baseband equivalent inductance which limits attainable baseband impedance and bandwidth. Therefore, the increase in equivalent capacitance value Ceq, due to harmonic trap 326 allows a reduction in overall baseband equivalent inductance which directly benefits baseband impedance and bandwidth. In other words the design of the harmonic trap 326 may be chosen in such a way to directly benefit baseband impedance and bandwidth.

Using these equations for capacitance value $C_{eq}$ and inductance value $L_{D2}$, capacitance values $C_{ds}$, $C_{DC}$, and $C_1$ may be used as independent design variables for establishing the condition of a 0° insertion phase and a 90° fundamental match phase for output network 306 at the fundamental resonance frequency $f_0$. As should be appreciated at this point, some of the embodiments provided herein relate to a combined matching circuit that acts as a 90° impedance inverter that may enable high bandwidth, minimum phase (inverted) Doherty solutions whilst simultaneously incorporating harmonic termination circuitry and wideband baseband termination circuitry.

FIG. 6 shows illustrative LC circuit-based harmonic traps 426 that may be used as harmonic traps 226 and 326 shown in FIGS. 4 and 5, respectively. In the present example, harmonic traps 426 may include any desired number of harmonic traps, each including an inductance 402 and a capacitance 404 coupled in series between node 428 and ground node 450 to create a resonant circuit. Each harmonic trap is coupled in parallel with each other harmonic trap of harmonic traps 426. Each harmonic trap resonates at a harmonic frequency $f_n$ determined by the inductance value $L_n$ of the inductance 402-$n$ and the capacitance value $C_n$ of capacitance 404-$n$ of the associated harmonic trap according to the following equation:

$$f_n = \frac{1}{2\pi\sqrt{L_n C_n}}$$

The harmonic frequencies $f_1$-$f_n$ (e.g., n=1 ... 5 or more) at which harmonic traps 426 resonate are all different harmonics of the fundamental resonance frequency, $f_0$, in which harmonic traps 426 are included. In particular, $f_1$ may correspond to the second harmonic of the fundamental resonance frequency $f_0$, equivalent to twice the fundamental resonance frequency $f_0$, or, put more simply, equal to $2f_0$. As another example, $f_2$ may correspond to the third harmonic of the fundamental resonance frequency $f_0$, equivalent to three times the fundamental resonance frequency $f_0$, or, put more simply, equal to $3f_0$. Another possibility could be that all resonance frequencies $f_1$-$f_n$ could lie inside the same harmonic band (2× fundamental band or 3× fundamental band ... ) but may resonate at different discrete frequencies. Consequently, the bandwidth of the harmonic traps in a specific band may be improved.

The harmonic traps 426 may substantially remove signal energy at the harmonic frequencies $f_1$-$f_n$ from signals that pass through the output network by coupling the signal energy at these harmonic frequencies to ground. The ground node 450 may be a ground-plane formed as a portion of a package housing that contains harmonic traps 426. This effectively reduces frequency dispersion on the output network. It should be noted that, rather than being included in an output network, harmonic traps 426 could instead be coupled to a path between an input network and the gate of a transistor in an amplifier path (e.g., at node 112 shown in FIG. 3).

While LC circuit-based harmonic traps 426 may be beneficial for removing undesired signal energy at harmonic frequencies from signals passing through the output network, conventional LC circuits that could be in harmonic traps 426 may limit the bandwidth of the amplifier due to parasitics associated with lumped/discrete LC components. Thus, it may be beneficial to use harmonic traps as part of the input or output matching network of an amplifier that are capable of being implemented as part of the amplifier package or as part of the integrated circuit die on which the amplifier is formed. As described below, radial stubs may be suitable for this purpose.

Figure 7:
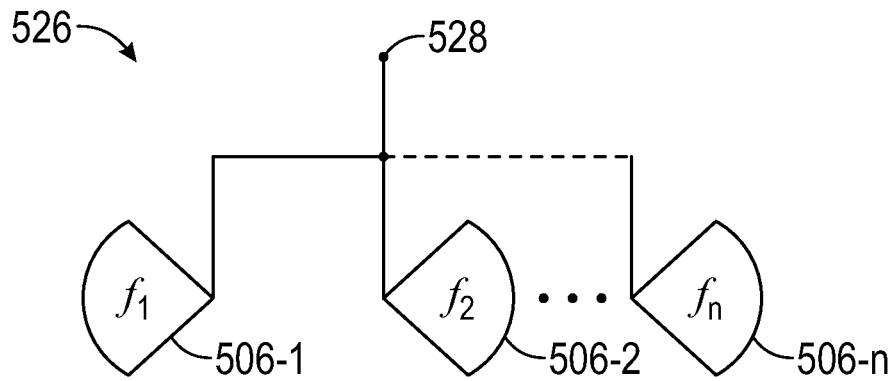
FIG. 7 is a diagram of an illustrative harmonic trap circuit of the type shown in FIGS. 4 and 5 having multiple radial stubs that may be coupled to the same node and that may each exhibit resonance centered around a respectively different resonance frequency.

FIG. 7 shows illustrative radial stub harmonic traps 526 that may be used as harmonic traps 226 and 326 shown in FIGS. 4 and 5, respectively. In the present example, harmonic traps 526 may include any desired number of radial stubs $506_1$-$506_n$. Each radial stub 506 is coupled to node 528, which connects radial stubs 506 to the signal path of an output network of which harmonic traps 526 are a part. Each radial stub 506 resonates at a harmonic frequency $f_n$ determined by the value of the radius of the radial stub 506 and the angle of the fan of the radial stub 506.

As shown, a radial stub is a planar, electrically conductive component that is shaped as a sector of a circle, giving the radial stub a fan-like shape. Radial stubs may be, for example, formed from a conductive layer in the form of a modified microstrip transmission line. Radial stubs may be preferred compared to rectangular stubs due to the comparatively low impedance of radial stubs. Additionally, rectangular stubs may suffer from narrow impedance bandwidths, whereas the impedance bandwidths of radial stubs are comparatively larger. Particularly, radial stubs provide low impedance levels with a well-defined insertion point over a wide frequency range, making them ideal for use in broadband harmonic termination circuits.

The harmonic frequencies $f_1$-$f_n$ at which harmonic traps 526 resonate are all different harmonics of a fundamental resonance frequency, $f_0$, in which harmonic traps 526 are included. In particular, $f_1$ may correspond to the second harmonic of the fundamental resonance frequency $f_0$, equivalent to twice the fundamental resonance frequency $f_0$, or, put more simply, equal to $2f_0$. As another example, $f_2$ may correspond to the third harmonic of the fundamental resonance frequency $f_0$, equivalent to three times the fundamental resonance frequency $f_0$, or, put more simply, equal to $3f_0$. Another possibility could be that all resonance frequencies $f_1$-$f_n$ could lie inside the same harmonic band (2× fundamental band or 3× fundamental band ... ) but may resonate at different discrete frequencies. Consequently, the bandwidth of the harmonic traps in a specific band may be improved.

The radial stubs 506 provide harmonic termination of signal energy at harmonic frequencies of signals that pass through the output network by coupling the signal energy at these harmonic frequencies to a ground node. The ground may be a ground-plane underlying each radial stub 506, and formed from a portion of a die, an integrated passive device, a printed circuit board, or a package housing in which radial stubs 506 are contained. This effectively reduces frequency dispersion on the output network. Using radial stubs 506 as harmonic traps may provide superior bandwidth capability compared to using the discrete LC-based harmonic traps 426 shown in FIG. 6. It should be noted that, rather than being included in an output network, harmonic traps 526 could instead be coupled to a path between an input network and the gate of a transistor in an amplifier path (e.g., at node 112 shown in FIG. 3). Radial stubs 506 may be disposed as part of the amplifier package, or as part of an integrated passive device, or as part of a distinct printed circuit board, or as part of the integrated circuit die on which the amplifier is formed, if desired.

Figure 8:
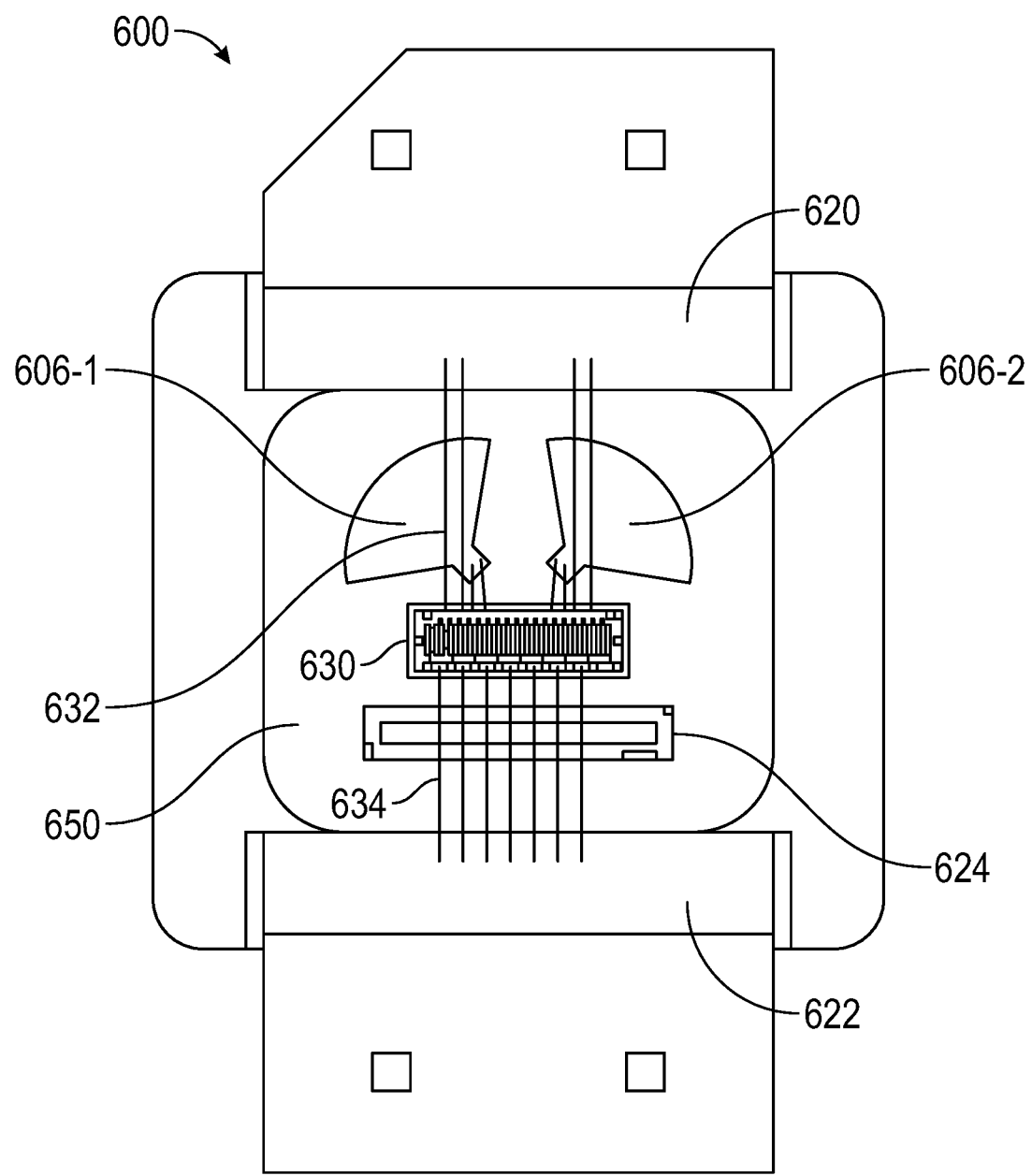
FIG. 8 is a top-down view of an illustrative circuit package for an amplifier of the type shown in FIG. 3 having radial stub harmonic traps coupled to an output of the power amplifier.

FIG. 8 shows a top-down view of an illustrative power amplifier package which includes radial stub harmonic traps in the output network of an amplifier. Package 600 may include an implementation of the amplifier path 100 shown in FIG. 3. Package 600 includes a die 630, a capacitor 624 (e.g., a Metal Oxide Semiconductor (MOS) capacitor), a drain conductor 620 (e.g., a first package lead), a gate conductor 622 (e.g., a second package lead), a ground-plane substrate 650 (e.g., a conductive flange), a first radial stub harmonic trap 606-1, and a second radial stub harmonic trap 606-2. Die 630, capacitor 624, and harmonic traps 606-1, 606-2 are coupled to the top surface of the substrate 624, and conductors 620, 622 are electrically isolated from the substrate 624 with an isolation structure. Capacitor 624 should not be limited to a MOS capacitor and may instead be any desired capacitor type implemented as an integrated passive device. Ground-plane substrate 650 may be formed from a conductive portion of a housing of package 600. Die 630 includes a transistor such as transistor 102 shown in FIG. 3 having a drain, source, and gate. It should be noted that the transistor is not necessarily limited to a Field Effect Transistor (FET) having a drain source and gate, but instead may be any desired transistor type of transistor, such as a bipolar transistor having a base, collector, and emitter. Drain conductor 620 may be considered an output node for the transistor, while gate conductor 622 may be considered an input node for the transistor. Capacitor 624 may be a shunt capacitor forming part of an input impedance matching network for the amplifier. Drain conductor 620 is coupled to the drain (e.g., output node) of the transistor on die 630 using bonds 632, which may be wirebonds. Gate conductor 630 is coupled to a first electrode of capacitor 624 and to the gate (e.g., input node) of the transistor on die 630 using bonds 634, which may be wirebonds. Radial stub harmonic traps 606-1 and 606-2 may be coupled to the drain of the transistor on die 630 as part of an output network to provide a path to ground for signal energy at harmonic frequencies at the output of die 630. Radial stub harmonic trap 606-1 may have different dimensions compared to radial stub harmonic trap 606-2 such that radial stub harmonic trap 606-1 resonates at a frequency (e.g., a second harmonic frequency of the fundamental operational frequency of the amplifier) that is different from the frequency at which radial stub harmonic trap 606-2 resonates (e.g., a third harmonic frequency of the fundamental operational frequency of the amplifier). The number of harmonic traps 606 shown here is merely illustrative and it should be understood that more or fewer radial stub harmonic traps can be included in package 600 in order to terminate more or fewer harmonics, if desired.

Figure 9:
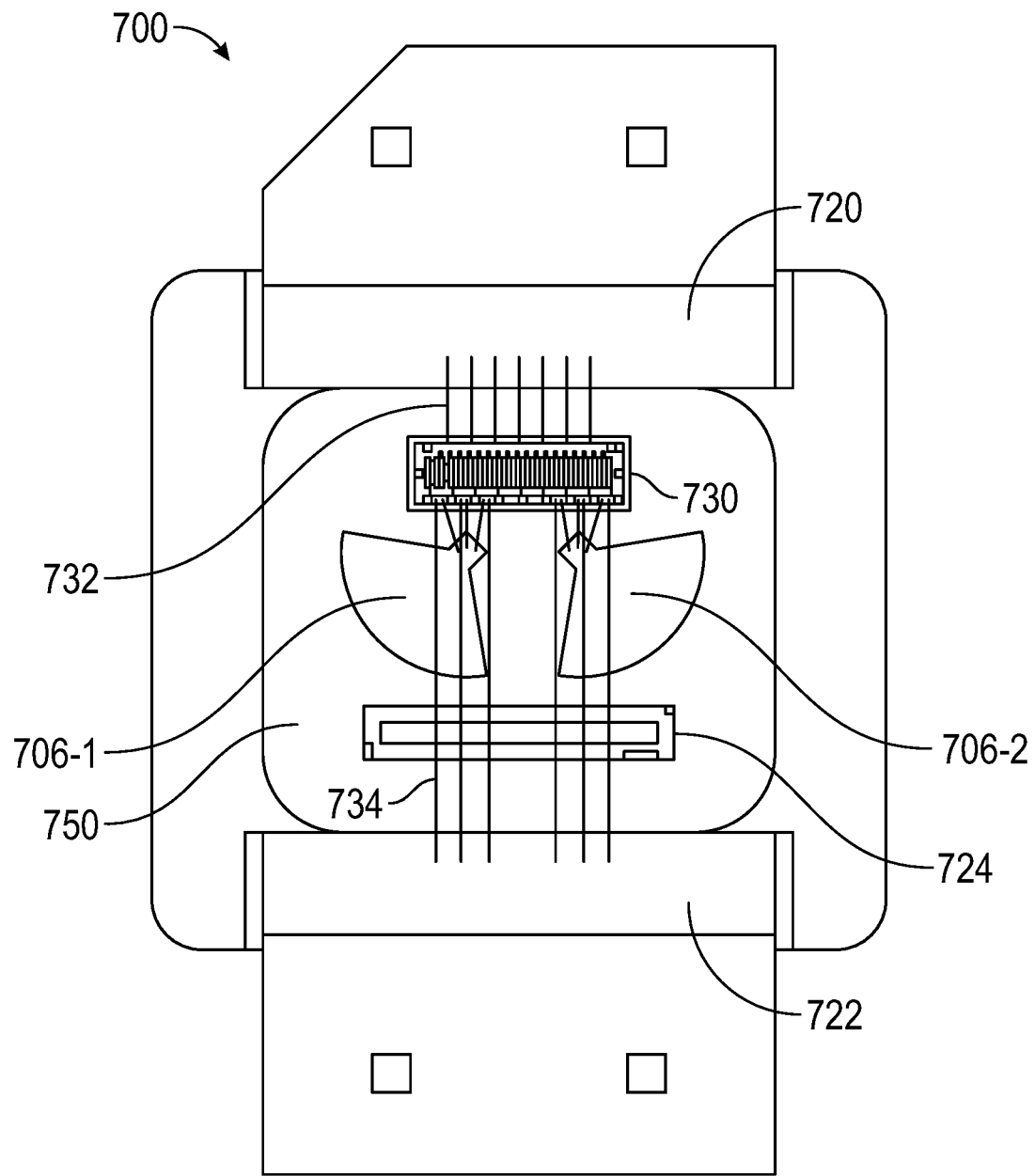
FIG. 9 is a top-down view of an illustrative circuit package for an amplifier of the type shown in FIG. 3 having radial stub harmonic traps coupled to an input of the power amplifier.

FIG. 9 shows a top-down view of an illustrative package which includes radial stub harmonic traps in the input network of an amplifier. Package 700 may be an implementation of the amplifier path 100 shown in FIG. 3. Package 700 includes a die 730, a capacitor 724 (e.g., a MOS capacitor), a drain conductor 720 (e.g., a first package lead), a gate conductor 722 (e.g., a second package lead), a ground-plane substrate 750, a first radial stub harmonic trap 706-1, and a second radial stub harmonic trap 706-2. Die 730, capacitor 724, and harmonic traps 706-1, 706-2 are coupled to the top surface of the substrate 724, and conductors 720, 722 are electrically isolated from the substrate 724 with an isolation structure. Capacitor 724 should not be limited to a MOS capacitor and may instead be any desired capacitor type implemented as an integrated passive device. Ground-plane substrate 750 may be formed from a conductive portion of a housing of package 700. Die 730 includes a transistor such as transistor 102 shown in FIG. 3 having a drain, source, and gate. It should be noted that the transistor is not necessarily limited to a FET having a drain source and gate, but instead may be any desired transistor type of transistor, such as a bipolar transistor having a base, collector, and emitter. Drain conductor 720 may be considered an output node for the transistor, while gate conductor 722 may be considered an input node for the transistor. Capacitor 724 may be a shunt capacitor forming part of an input impedance matching network for the amplifier. Drain conductor 720 is coupled to the drain (e.g., output node) of the transistor on die 730 using bonds 732, which may be wire-bonds. Gate conductor 730 is coupled to a first electrode of capacitor 724 and to the gate (e.g., input node) of the transistor on die 730 using bonds 734, which may be wirebonds. Radial stub harmonic traps 706-1 and 706-2 may be coupled to the gate of the transistor on die 730 as part of an input network to provide a path to ground for signal energy at harmonic frequencies at the gate input of die 730. Radial stub harmonic trap 706-1 may have different dimensions compared to radial stub harmonic trap 706-2 such that radial stub harmonic trap 706-1 resonates at a frequency (e.g., a second harmonic frequency of the fundamental operational frequency of the amplifier) that is different from the frequency at which radial stub harmonic trap 706-2 resonates (e.g., a third harmonic frequency of the fundamental operational frequency of the amplifier). By incorporating harmonic traps 706 in the input network of amplifier path 100, amplifier efficiency may be increased as a result of the removal of disruptive signal energy at harmonic frequencies. However, it should be noted that some signal loss may be associated with harmonic traps 706, which may reduce the gain of the amplifier. The number of harmonic traps 706 shown here is merely illustrative and it should be understood that more or fewer radial stub harmonic traps can be included in package 700 in order to terminate more or fewer harmonics, if desired.

Figure 10:
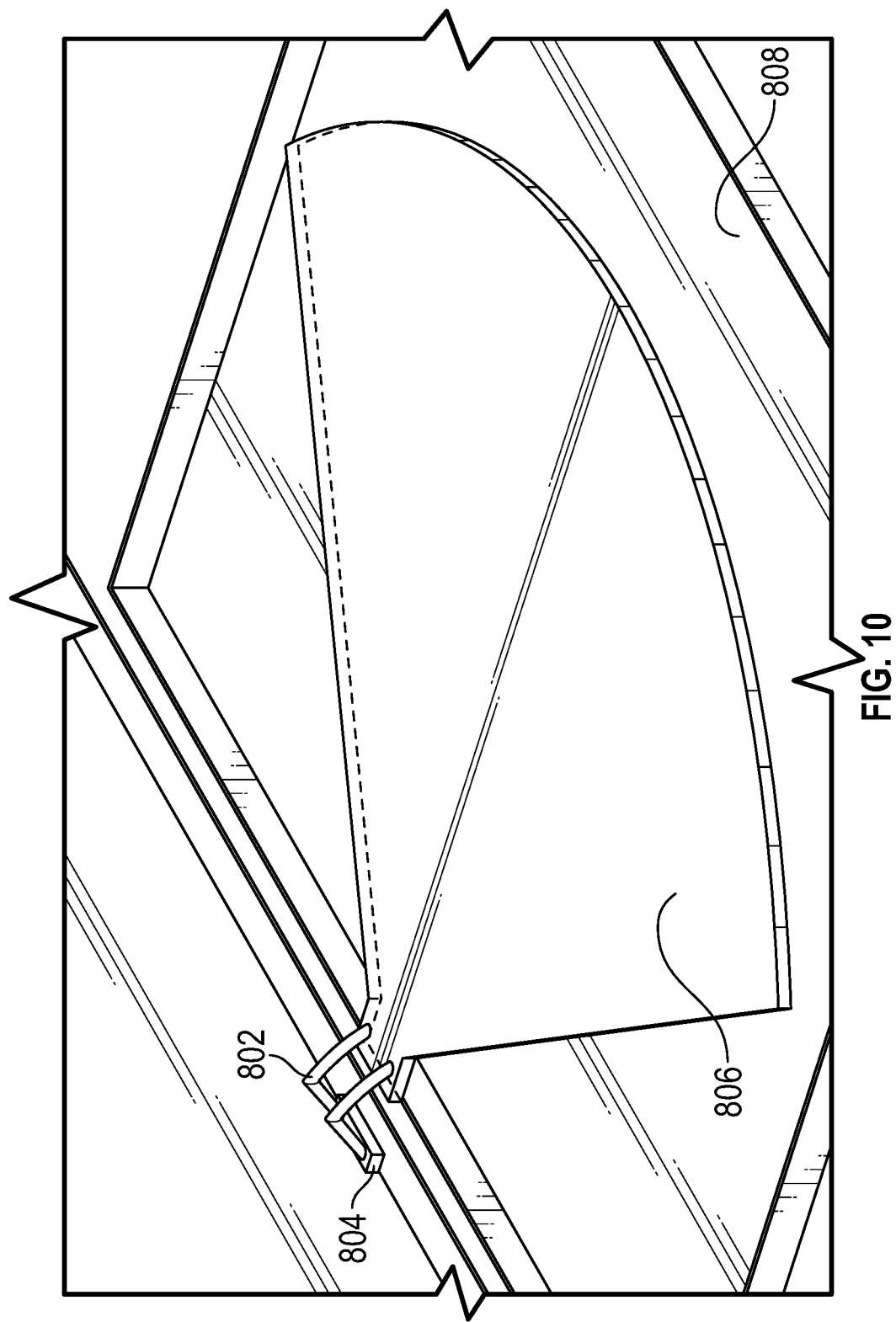
FIG. 10 is an isometric view of an illustrative circuit package showing a detailed view of a radial stub harmonic trap of the type shown in FIGS. 7-9.

FIG. 10 shows an isometric view of an exemplary radial stub in a device package that may be used as a harmonic trap (e.g., as one of harmonic traps shown in FIGS. 4, 5, 7, 8, and 9). Radial stub 806 is coupled to contact 804 using wirebonds 802. Contact 804 may be connected to either the input or the output (e.g., the gate or the drain) of a transistor being used in an amplifier such as an inverted or non-inverted Doherty amplifier.

Radial stub 806 may be formed from conductive material such as copper on a dielectric substrate 808. For example, radial stub 806 may be a patterned metal layer formed on substrate 808 using electron-beam evaporation, sputtering, chemical vapor deposition, electroplating, or any other desired form of controllable metal deposition. Substrate 808 may preferably be printed circuit board (PCB) material, a compound semiconductor such as GaAs, glass material, or any other desired material. One factor that dictates the dimensions of radial stub 806 is the material used for substrate 808. Using materials with lower dielectric constants for substrate 808 may require radial stub 806 to be larger in size, which may cause radial stub 806 to be impractical to implement inside a device package. Using materials with higher dielectric constants for substrate 808 advantageously allows the radial stub 806 to be smaller in size.

TABLE 1

| Substrate | | | Radial stub | | |
|---|---|---|---|---|---|
| Thickness (mils) | Dk | 2f0 (GHz) | length (mils) | radius (deg) | size (mils) |
| GaAs 4 | 12.8 | 4 | 127 | 120 | 140 × 90 |
| RO3035 20 | 3.6 | 5.2 | 230 | 90 | 380 × 240 |
| 20 | 3.6 | 2.6 | 430 | 90 | 490 × 490 |
| RO4350B 10 | 3.66 | 7 | 170 | 60 | 370 × 330 |

As shown in Table 1, substrate thickness also dictates the size of a radial stub. A thinner substrate tends to reduce the stub dimensions. Thicker metallization allows a stub to handle more current and hence operate at higher power levels. This increased current handling associated with thicker metallization is also applicable for scenarios in which higher dielectric substrate material is used in order to reduce the dimensions of the radial stub. As frequency of operation increases, thicker metallization helps to compensate for signal losses that may occur at higher frequencies. Substrate material properties directly impact transmission line losses and size. Typically, when selecting a substrate material, there is a trade-off between the size of the radial stub and transmission line losses that occur at the radial stub. For example, the higher the dielectric constant of the substrate, the smaller the size of the radial stub, and the higher the transmission line losses at the radial stub. For example, using GaAs for substrate 808 reduces the size of radial stub 806 (e.g., the size required to achieve a given resonance) by over 50% compared to when substrate 808 is formed from PCB material. Using glass material to form substrate 808 provides similar radial stub size reduction over using PCB material as both glass material and GaAs have higher dielectric constants than conventional PCB materials.

Substrate 808 is mounted onto a ground-plane formed from a conductive housing of the package to create a capacitive coupling between radial stub 806 and the ground-plane. Substrate 808 may be attached using epoxy, solder reflow, or any other desired method of adhesion. For example, it may be desirable that a voidless method of adhesion such as solder reflow be used to attach substrate 808 to the ground-plane so that air pockets (i.e., voids) are not present between substrate 808 and the ground-plane. In particular, the dielectric constant of air is low, so when pockets of air are introduced between substrate 808 and the ground-plane, the effective dielectric constant between the ground-plane and radial stub 806 is lowered, which may be undesirable.

Alternatively, substrate 808 may be formed having a metallic backside coating for potentially improved adhesion to the ground-plane of the package, as, for example, is often the case with conventional microstrip line. In such alternative cases, appropriate metal-to-metal bonding techniques such as solder reflow may be used, keeping in mind that voidless adhesion is still preferred.

In some instances, rather than having a separate substrate for radial stub 806, it may be advantageous to include radial stub 806 on the same die 630 or 730, shown in FIGS. 8 and 9, on which the power transistor is formed. In particular, transmission line losses introduced by wirebonds 802 can be avoided by using on-chip interconnects instead when radial stub 806 is formed on the active die 630/730. This monolithic approach to harmonic termination is especially practical when the die 630/730 has a compound semiconductor substrate with a high dielectric constant, such as GaAs or GaN.

As indicated above, the success of designing wideband Doherty PA for concurrent multi-band operation depends primarily on broadband fundamental match, harmonic traps and wider VBW. In particular, for power amplifiers that utilize GaN transistors with relatively low output parasitic capacitance (e.g., when compared with silicon-based FETs), providing broadband harmonic traps at the gate/drain (current generator) reference plane becomes very important to achieving good performance.

To circumvent the conventional in-package input/output narrowband harmonic trap solutions, a microstrip line based λ/4 open-circuited radial stub has been proposed herein, which is proven to achieve wideband performance at higher frequencies. The embodiments, however, are not limited to the use of radial stubs as harmonic terminations. The various embodiments also include the use of one or more harmonic traps for any given harmonic frequency range to further improve bandwidth.

By carefully designing shunt-L pre-match at the fundamental operational frequency of the amplifier, the overall equivalent output capacitance including Cds and the contribution from the harmonic traps can be resonated out. This enables a low dispersion, inverted Doherty friendly architecture suitable for broadband PA. Specifically, a goal for wideband Doherty is to enable 90 degree inverter/match at the fundamental operational frequency of the amplifier. The combined circuit may have a secondary benefit of improving baseband impedance, due to fact that adding one or more harmonic traps may reduce required shunt-L (LD2) inductance.

The above-described embodiments present broadband fundamental, harmonic and baseband terminations. One or more harmonic traps in particular can be adopted for $2^{nd}$, $3^{rd}$, ... $n^{th}$ order harmonics. Further the proposed harmonic traps can be implemented on the drain side and/or the gate side in order to accomplish broadband drain and/or gate harmonic termination.

Amplifier embodiments described herein include one or more L-C and/or radial stub resonators resonating at different harmonic frequencies spread across one or more harmonic bands, which can be used as harmonic traps both on the input and output for any orders of harmonic frequency. Component values for the harmonic trap(s) may be chosen in accordance with the considerations described previously to provide most appropriate trade-offs between harmonic and fundamental bandwidth. In an embodiment, the equations provided above for Ceq and LD2 may be employed for this purpose with Cds, C1 and CDC as "independent" design variables. Furthermore, the system impedance or Ro (i.e., impedance that devices are matched to at peak power) may be included as an independent design variable in the overall optimization effort. LD1 inductance also may be considered as a controllable input design variable if other practical design considerations allow this.

The various embodiments are not restricted to an in-package solution. In fact the chip-on-board approach may be beneficial to remove space restrictions due to package, open up possibilities for additional z-axis build dimension, optimize interconnects, eliminate/minimize certain parasitic elements such as lead frame capacitance, reduce length of LD1 bond-wires, bring microstrip lines closer to the gate/drain pads, and allow more flexibility in realizing harmonic traps using radial stub structures on a PCB. As an alternative, an in-package solution is also feasible by realizing one or more L-C resonators in the form of integrated passive devices (IPDs) close to the die. On the other hand, the physical size of radial stubs could be significantly reduced when realized using high Dk and high-Q substrate material (e.g., glass) to fit into the package.

It is important to note that the preceding detailed description of broadband harmonic termination for input and output matching circuits for amplifiers is not limited for use in only Doherty PAs or inverted Doherty PAs. The present disclosure is equally valid for single-path PA applications with other efficiency enhancement schemes such as envelope tracking or drain bias modulation, where appropriate harmonic termination is important to ultimately achieving good overall wideband amplifier performance.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

In accordance with an embodiment, a system may include an amplifier having an output node and an output network. The output network may include an input coupled to the output node of the amplifier, one or more harmonic traps coupled to the input, a shunt-L path, and a baseband termination path. The shunt-L path may include a capacitor and an inductance. The capacitor and the inductance may be coupled in series between the input and a ground node. The baseband termination path may be coupled between the ground node and a node between the capacitor and the inductance of the shunt-L path.

In accordance with an aspect of the embodiment, the one or more harmonic traps may include one or more radial stubs coupled between the input and the ground node.

In accordance with an aspect of the embodiment, the amplifier may be configured to operate at a fundamental operating frequency. At least one of the one or more radial stubs may have a respective resonance frequency corresponding to a harmonic of the fundamental operating frequency.

In accordance with an aspect of the embodiment, the amplifier may be configured to operate at a fundamental operating frequency. Each of the one or more radial stubs may be configured to pass signal energy within a harmonic band to the ground node.

In accordance with an aspect of the embodiment, the one or more harmonic traps may include a first resonant circuit comprising a first inductance and a first capacitor. The first capacitor and the first inductance may be coupled in series between the input and the ground node.

In accordance with an aspect of the embodiment, the one or more harmonic traps may further include a second resonant circuit that includes a second inductance and a second capacitor. The second capacitor and the second inductance may be coupled in series between the input and the ground node. The second resonant circuit may be coupled in parallel with respect to the first resonant circuit.

In accordance with an aspect of the embodiment, the amplifier may be configured to operate at a fundamental operating frequency. The first and second resonant circuits may each have a respective resonance frequency corresponding to a harmonic of the fundamental operational frequency.

In accordance with an aspect of the embodiment, the amplifier may include a gallium nitride (GaN) power transistor.

In accordance with an aspect of the embodiment, the system may include a bias transmission line that electrically connects an output of the output network to a voltage source, wherein the bias transmission line has an adjustable electrical length.

In accordance with an aspect of the embodiment, the system may include a load impedance and a transmission line coupled between the load impedance and the output of the output network. The output network may further include at least one wire-bond directly coupled between the output network and an input of the transmission line.

In accordance with an aspect of the embodiment, the output network may further include a shunt capacitor directly coupled to the input of the transmission line In accordance with an aspect of the embodiment, the output network may further include a shunt capacitor directly coupled to the output of the transmission line.

In accordance with an aspect of the embodiment, the output network may be coupled between the output of the amplifier and a load. The output network may be an impedance inverter that provides a 90 degree insertion phase between the input of the output network and the load.

In accordance with an embodiment, an output impedance matching network of an amplifier may include an input electrically connected to an output node of the amplifier, one or more harmonic traps electrically connected to the input, an inductance electrically connected to the input, a capacitor electrically connected in series with the inductance between the inductance and the ground node, and a baseband termination path coupled between the ground node and a node coupled between the inductance and the capacitor.

In accordance with an aspect of the embodiment, the one or more harmonic traps may include one or more radial stubs electrically connected to the input. A radial stub of the one or more radial stubs may have a resonance frequency that corresponds to a harmonic of a fundamental operating frequency of the amplifier.

In accordance with an aspect of the embodiment, the one or more harmonic traps may include one or more resonant circuits. The one or more resonant circuits may each have a respective resonance frequency corresponding to a harmonic of a fundamental operating frequency of the amplifier.

In accordance with an aspect of the embodiment, the output impedance matching network may include an additional inductance electrically connected between the input and an output of the output impedance matching network, and a bias transmission line that electrically connects the output to a voltage source. The bias transmission line may have an adjustable electrical length.

In accordance with an aspect of the embodiment, the output impedance matching network may include an output coupled to a load. The output impedance matching network may be an impedance inverter that provides a 90 degree insertion phase between the input and the load.

In accordance with an embodiment, an electronic circuit may include an amplifier having an output node and an output impedance matching network. The output impedance matching network may include an input electrically connected to the output node of the amplifier, one or more harmonic traps electrically connected to the input, a shunt-L path electrically connected to the input, and a baseband termination path electrically connected to a RF cold point node of the shunt-L path.

In accordance with an aspect of the embodiment, the one or more harmonic traps may include one or more radial stubs electrically connected to the input. A radial stub of the one or more radial stubs may have a resonance frequency that corresponds to a harmonic of a fundamental operating frequency of the electronic circuit.

In accordance with an aspect of the embodiment, the electronic circuit may include an inductance electrically connected between the input and an output of the output impedance matching network, and a bias transmission line that electrically connects the output to a voltage source. The bias transmission line may have an adjustable electrical length.

In accordance with an aspect of the embodiment, the one or more harmonic traps may include a first resonant circuit that includes a first inductance electrically connected to the input and a first capacitor electrically connected between the first inductance and a ground node.

In accordance with an aspect of the embodiment, the one or more harmonic traps may include a second resonant circuit that includes a second inductance electrically connected to the input and a second capacitor electrically connected between the second inductance and the ground node. The first resonant circuit may have a first resonance frequency. The second resonant circuit may have a second resonance frequency. The first and second resonance frequencies may correspond to different harmonics of a fundamental operational frequency of the electronic circuit.

In accordance with an aspect of the embodiment, the output of the output impedance matching network may be electrically connected to a load. The output impedance matching network may be an impedance inverter that provides a 90 degree insertion phase between the input and the load.

In accordance with an aspect of the embodiment, the baseband termination path includes a baseband capacitor, a baseband inductance, and a baseband resistor. The baseband capacitor, the baseband inductance, and the baseband resistor may be electrically connected in series between the RF cold point node and the ground node.

In accordance with an embodiment, an amplifier package may include a conductive housing including a ground plane, an integrated circuit die disposed on the ground plane, and a radial stub harmonic trap formed on a substrate that is disposed on the ground plane. The integrated circuit die may include a transistor having a control terminal and an output terminal. The radial stub harmonic trap may be coupled to the transistor.

In accordance with an aspect of the embodiment, the radial stub harmonic trap may be coupled to the control terminal of the transistor.

In accordance with an aspect of the embodiment, the radial stub harmonic trap may be coupled to the output terminal of the transistor.

In accordance with an aspect of the embodiment, the integrated circuit die may include an output impedance matching network that is tuned to a fundamental operating frequency. The radial stub harmonic trap may have a resonance frequency that is a harmonic of the fundamental operating frequency.

In accordance with an aspect of the embodiment, the radial stub harmonic trap may be configured to route signal energy at the resonance frequency to the ground-plane.

In accordance with an aspect of the embodiment, the substrate may be formed from compound semiconductor material or glass. The radial stub harmonic trap may include a patterned metal layer formed on the substrate.

In accordance with an aspect of the embodiment, the substrate may be formed from gallium nitride (GaN). The transistor may be a GaN transistor.

In accordance with an aspect of the embodiment, the radial stub harmonic trap may be directly coupled to the transistor using wire-bonds.

In accordance with an aspect of the embodiment, the amplifier package may also include an additional radial stub harmonic trap disposed on the ground plane. The additional radial stub harmonic trap may be coupled to the transistor.

In accordance with an aspect of the embodiment, the radial stub harmonic trap may have a first resonance frequency that is a second harmonic of a fundamental operating frequency of the amplifier. The additional radial stub harmonic trap may have a second resonance frequency that is a third harmonic of the fundamental operating frequency. The radial stub harmonic trap may be configured to route signal energy at the first resonance frequency to the ground-plane. The additional radial stub harmonic trap may be configured to route signal energy at the second resonance frequency to the ground-plane.

In accordance with an embodiment, a packaged radio frequency (RF) amplifier device may include a conductive ground-plane, a substrate disposed on the ground-plane, a transistor that is formed on the substrate and that includes a control terminal and an output terminal, and a radial stub harmonic trap that is formed on the substrate and that is electrically connected to the transistor.

In accordance with an aspect of the embodiment, the radial stub harmonic trap may be electrically connected to the control terminal of the transistor.

In accordance with an aspect of the embodiment, the radial stub harmonic trap may be electrically connected to the output terminal of the transistor.

In accordance with an aspect of the embodiment, the packaged RF amplifier device may include an output impedance matching network formed on the substrate that is tuned to a fundamental operating frequency. The radial stub harmonic trap may be configured to resonate at a frequency that is a harmonic of the fundamental operating frequency. The radial stub harmonic trap may be further configured to route signal energy at the resonance frequency to the ground-plane.

In accordance with an aspect of the embodiment, the substrate may be formed from gallium nitride (GaN). The radial stub harmonic trap may include a patterned metal layer formed on a surface of the substrate.

In accordance with an embodiment, an electronic device may include a ground-plane, a substrate disposed on the ground-plane, a transistor that includes a control terminal and an output terminal, and a radial stub that is formed on the substrate and that is electrically connected to the transistor.

In accordance with an aspect of the embodiment, the electronic device may include an output impedance matching network formed on the substrate that is tuned to a fundamental operating frequency. The radial stub may be electrically connected to the output terminal of the transistor. The radial stub may be configured to resonate at a frequency that is a harmonic of the fundamental operating frequency. The radial stub is further configured to route signal energy at the resonance frequency to the ground-plane.

In accordance with an aspect of the embodiment, the electronic device may include an additional radial stub formed on the substrate. The additional radial stub may be coupled to the transistor in parallel with the radial stub.

In accordance with an aspect of the embodiment, the harmonic may be a second harmonic of the fundamental operating frequency. The additional radial stub may have an additional resonance frequency that is a third harmonic of the fundamental operating frequency. The additional radial stub may be configured to route signal energy at the additional resonance frequency to the ground-plane.

In accordance with an aspect of the embodiment, the substrate may be formed from gallium nitride. The radial stub may include a patterned metal layer formed on the substrate.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier package comprising:
a conductive housing comprising a ground-plane; and
an integrated circuit die disposed on an upper surface of the ground-plane, the integrated circuit die comprising:
a semiconductor substrate disposed on the upper surface of the ground-plane;
a transistor formed from the semiconductor substrate, the transistor having a control terminal and an output terminal each disposed directly on the semiconductor substrate;
a radial stub harmonic trap comprising a patterned metal layer that is disposed on and in direct physical contact with an upper surface of the semiconductor substrate; and
an on-chip interconnect formed on the semiconductor substrate, wherein the on-chip interconnect couples the radial stub harmonic trap to the transistor.

2. The amplifier package of claim 1, wherein the radial stub harmonic trap is coupled to the output terminal of the transistor by the on-chip interconnect.

3. The amplifier package of claim 2, the integrated circuit die further comprising:
an output impedance matching network that is tuned to a fundamental operating frequency, wherein the radial stub harmonic trap has a resonance frequency that is a harmonic of the fundamental operating frequency.

4. The amplifier package of claim 3, wherein the radial stub harmonic trap is configured to route signal energy at the resonance frequency to the ground-plane.

5. The amplifier package of claim 1, wherein the semiconductor substrate comprises a compound semiconductor material.

6. The amplifier package of claim 5, wherein the semiconductor substrate comprises gallium nitride (GaN), and wherein the transistor comprises a GaN transistor.

7. The amplifier package of claim 1, further comprising:
an additional radial stub harmonic trap disposed on the integrated circuit die; and
a second on-chip interconnect that couples the additional radial stub harmonic trap to the transistor.

8. The amplifier package of claim 7, wherein the radial stub harmonic trap has a first resonance frequency that is a second harmonic of a fundamental operating frequency of an amplifier that includes the transistor, wherein the additional radial stub harmonic trap has a second resonance frequency that is a third harmonic of the fundamental operating frequency, wherein the radial stub harmonic trap is configured to route signal energy at the first resonance frequency to the ground-plane, and wherein the additional radial stub harmonic trap is configured to route signal energy at the second resonance frequency to the ground-plane.

9. The amplifier package of claim 1, wherein the radial stub harmonic trap is coupled to the control terminal of the transistor by the on-chip interconnect.

10. A packaged radio frequency (RF) amplifier device comprising:
a conductive ground-plane;
a semiconductor substrate disposed on an upper surface of the ground-plane;
a transistor that is formed at least partially from the semiconductor substrate and that includes a control terminal and an output terminal each disposed directly on the semiconductor substrate; and
a radial stub harmonic trap that is formed on the top surface of the semiconductor substrate and that is electrically connected to the transistor.

11. The packaged RF amplifier device of claim 10, wherein the radial stub harmonic trap is electrically connected to the output terminal of the transistor.

12. The packaged RF amplifier device of claim 11, further comprising:
an output impedance matching network formed on the semiconductor substrate that is tuned to a fundamental operating frequency, wherein the radial stub harmonic trap is configured to resonate at a frequency that is a harmonic of the fundamental operating frequency, and wherein the radial stub harmonic trap is further configured to route signal energy at the resonance frequency to the ground-plane.

13. The packaged RF amplifier device of claim 10, wherein the radial stub harmonic trap is electrically connected to the control terminal of the transistor.

14. The packaged RF amplifier device of claim 10, wherein the semiconductor substrate comprises gallium nitride (GaN), and wherein the radial stub harmonic trap comprises a patterned metal layer formed on the upper surface of the semiconductor substrate.

15. An electronic device comprising:
a ground-plane;
a semiconductor substrate disposed on an upper surface of the ground-plane, such that a lower surface of the semiconductor substrate is directly attached to the upper surface of the ground-plane;

a transistor that is formed from the semiconductor substrate, and that includes a control terminal and an output terminal each disposed directly on the semiconductor substrate;

a first radial stub that is formed on an upper outer surface of the semiconductor substrate and that is electrically connected to the transistor; and a second radial stub that is formed on the upper outer surface of the semiconductor substrate and that is electrically connected to the transistor.

16. The electronic device of claim 15, further comprising:

an output impedance matching network formed on the semiconductor substrate that is tuned to a fundamental operating frequency, wherein the first radial stub is electrically connected to the output terminal of the transistor, wherein the first radial stub is configured to resonate at a frequency that is a harmonic of the fundamental operating frequency, and wherein the first radial stub is further configured to route signal energy at the resonance frequency to the ground-plane.

17. The electronic device of claim 16, wherein the harmonic is a second harmonic of the fundamental operating frequency, wherein the second radial stub has an additional resonance frequency that is a third harmonic of the fundamental operating frequency, wherein the second radial stub is configured to route signal energy at the additional resonance frequency to the ground-plane.

18. The electronic device of claim 15, wherein the semiconductor substrate comprises gallium nitride, and wherein the first radial stub comprises a patterned metal layer formed on the semiconductor substrate.

* * * * *